(12) United States Patent
Chen et al.

(10) Patent No.: US 11,037,846 B2
(45) Date of Patent: Jun. 15, 2021

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventors: Chien-Hua Chen, Kaohsiung (TW); Hsu-Chiang Shih, Kaohsiung (TW); Cheng-Yuan Kung, Kaohsiung (TW); Hung-Yi Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/578,088

(22) Filed: Sep. 20, 2019

(65) Prior Publication Data

US 2021/0090965 A1    Mar. 25, 2021

(51) Int. Cl.
| | |
|---|---|
| *H01L 21/56* | (2006.01) |
| *H01L 23/28* | (2006.01) |
| *H01L 23/66* | (2006.01) |
| *H01Q 1/22* | (2006.01) |

(52) U.S. Cl.
CPC .............. *H01L 23/28* (2013.01); *H01L 21/56* (2013.01); *H01L 23/66* (2013.01); *H01Q 1/2283* (2013.01)

(58) Field of Classification Search
CPC ......... H01L 23/28; H01L 23/66; H01L 21/56; H01Q 1/2283
USPC ........................................................ 257/787
See application file for complete search history.

(56) References Cited

U.S. PATENT DOCUMENTS

| | | | | |
|---|---|---|---|---|
| 2009/0139749 | A1* | 6/2009 | Fan ..................... | B81B 7/0058 174/251 |
| 2012/0252165 | A1* | 10/2012 | Nakanoya ............... | H01L 24/97 438/107 |
| 2013/0292808 | A1* | 11/2013 | Yen ....................... | H01L 23/481 257/660 |
| 2016/0351492 | A1* | 12/2016 | Watanabe ............ | G01R 31/2856 |

OTHER PUBLICATIONS

US 10,297,529 B2, 05/2019, Costa et al. (withdrawn)

* cited by examiner

*Primary Examiner* — Tong-Ho Kim
(74) *Attorney, Agent, or Firm* — Foley & Lardner LLP

(57) ABSTRACT

A semiconductor package structure includes a substrate, a die electrically connected to the substrate, and a first encapsulant. The die has a front surface and a back surface opposite to the front surface. The first encapsulant is disposed between the substrate and the front surface of the die. The first encapsulant contacts the front surface of the die and the substrate.

17 Claims, 26 Drawing Sheets

SEMICONDUCTOR PACKAGE STRUCTURE AND METHOD OF MANUFACTURING THE SAME

BACKGROUND

1. Technical Field

The present disclosure relates to a semiconductor package structure. In particular, the semiconductor package structure includes high resistance active integrated circuits.

2. Description of the Related Art

For the fifth generation mobile networks (5G), millimeter wave becomes one of the most important factors because the bandwidth of the millimeter wave around 30-300 GHz is relatively clear and abundant compared to the bandwidth between 2.4-5 GHz. For example, active integrated circuit such as an antenna for the millimeter wave application can be further miniaturized to facilitate mobile device applications.

However, the miniaturized active integrated circuit packages may possess significant parasitic surface conduction in high frequency applications. Parasitic surface conduction may be caused by charge separation in the insulating layer below the active integrated circuit, such parasitic surface conduction may cause parasitic current or dark current which amounts to cross-talk effects between adjacent dies.

High resistance silicon substrate, for example, silicon-on-insulator (SOI), is used in high frequency applications. Along with the adoption of millimeter wave technology, SOI wafer can no longer resolve the problems caused by parasitic surface conduction.

SUMMARY

In some embodiments, according to one aspect of the present disclosure, a semiconductor package structure includes a substrate, a die electrically connected to the substrate, and a first encapsulant. The die has a front surface and a back surface opposite to the front surface. The first encapsulant is disposed between the substrate and the front surface of the die. The first encapsulant contacts the front surface of the die and the substrate.

In some embodiments, according to one aspect of the present disclosure, an antenna package structure includes a substrate, a die electrically connected to the substrate, and a package encapsulant. The die has a front surface and a back surface opposite to the front surface. The die includes an antenna structure and a first die encapsulant over the antenna structure. The package encapsulant is over the first die encapsulant of the die. The first die encapsulant and the package encapsulant are disposed over a vertical projection area of the antenna structure.

In some embodiments, according to another aspect of the present disclosure, a method is disclosed for manufacturing a semiconductor package structure. The method includes the following operations: providing a semiconductor wafer with a circuit layer, a dielectric layer under the circuit layer, a bulk silicon layer under the dielectric layer, and a conductive element protruding from the circuit layer; partially removing the circuit layer, the dielectric layer; and removing the bulk silicon layer by a wafer-level etching operation.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1A:
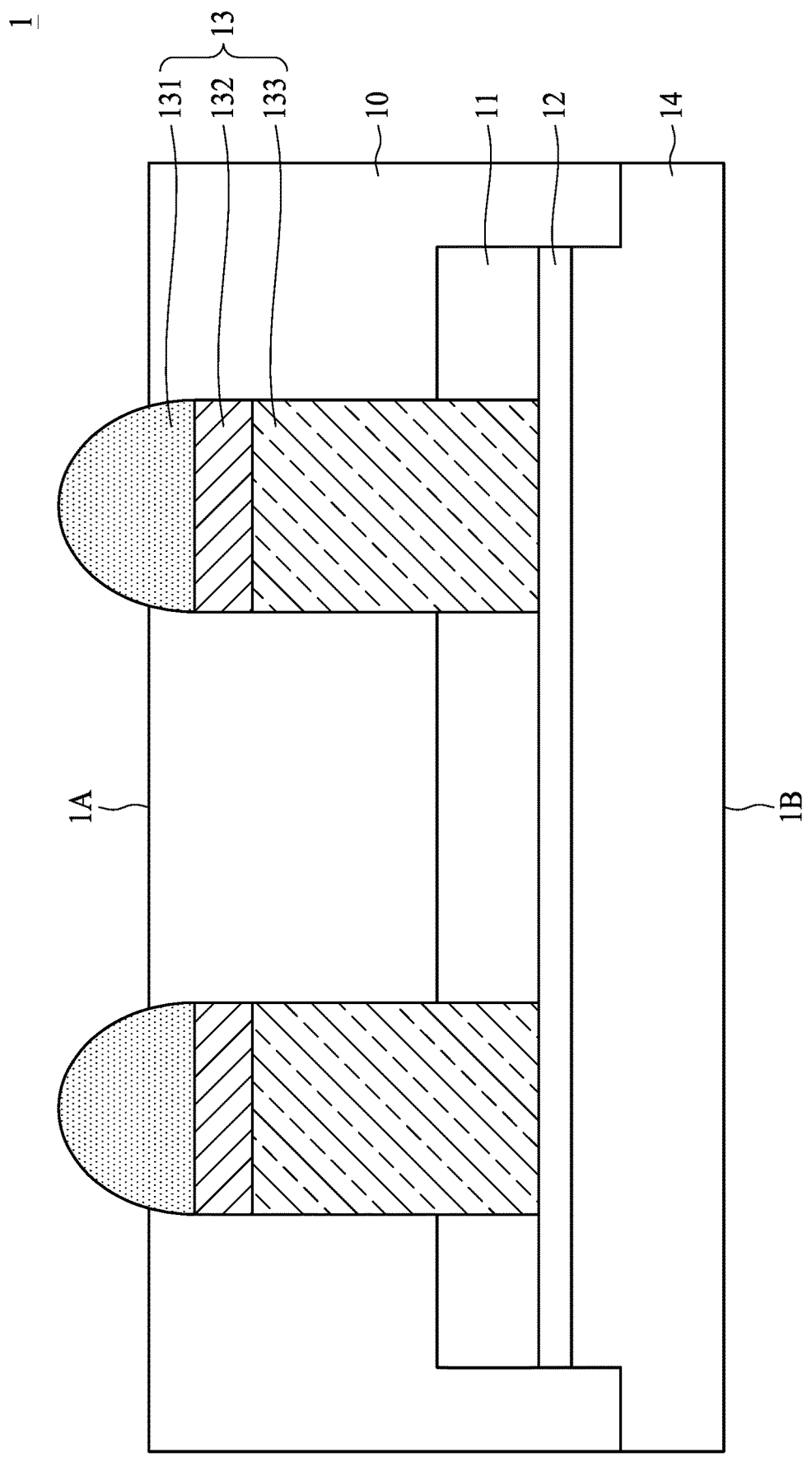
FIG. 1A illustrates a cross-sectional view of a die according to some embodiments of the present disclosure.

Common reference numerals are used throughout the drawings and the detailed description to indicate the same or similar components.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Regarding high resistive substrate approach in resolving parasitic surface conduction, in some comparative embodiments, a trap-rich layer is embedded in the insulating layer, for example, the bulk oxide layer in the SOI wafer, in order to capture the generated positive and negative charges. However, cost of the embedded trap-rich layer is too high to be adopted for regular production. Present disclosure provides a semiconductor package structure with high resistance active integrated circuits. To resolve the parasitic surface conduction, bulk semiconductor layer stacked with the insulating layer, for example, a bulk silicon underneath the bulk oxide layer, is removed, cutting off the parasitic current path.

FIG. 1A is a cross-sectional view of a die 1 in accordance with some embodiments of the present disclosure. The die 1 includes an encapsulant 10, a circuit layer 11, an insulating layer 12, a conductive element 13, and an encapsulant 14. The die 1 includes a front surface 1A and a back surface 1B opposite to the front surface 1A. In some embodiments, the circuit layer 11, the insulating layer 12, and the conductive element 13 may be an antenna structure. The encapsulant 10 may be a die encapsulant for protecting the antenna structure. The encapsulant 14 may be a die encapsulant for supporting the antenna structure.

The encapsulant 10 is proximal to the front surface 1A. The encapsulant 10 is disposed on the encapsulant 14. The encapsulant 10 covers the encapsulant 14, the circuit layer 11, and the insulating layer 12. The encapsulant 10 surrounds the antenna structure. The encapsulant 10 encapsulates the circuit layer 11, the insulating layer 12, the conductive element 13, and the encapsulant 14. The encapsulant 14 is proximal to the back surface 1B. There is an interface between the encapsulant 10 and the encapsulant 14. In some embodiments, the encapsulant 14 has a stepped structure.

The circuit layer 11 is disposed on the insulating layer 12. The circuit layer 11 and the insulating layer 12 are stacked on the encapsulant 14. The circuit layer 11 and the insulating layer 12 are surrounded by the encapsulant 10. The antenna structure is surrounded by the encapsulant 10. The conductive element 13 is disposed on the insulating layer 12. The circuit layer 11 functions as an active layer. The circuit layer 11 may include a passivation layer.

The conductive element 13 includes a conductive material 131, a conductive layer 132, and a conductive post 133. In some embodiments, the conductive material 131 may include solder (Sn) or other suitable materials. The conductive layer 132 may include nickel (Ni) or other suitable materials. The conductive post 133 may include copper (Cu) or other suitable materials. In some embodiments, the conductive element 13 may extends from a top surface (e.g. active surface) of the circuit layer 11 to the front surface 1A of the die 1. That is, the conductive element 13 may be disposed on an active surface of the circuit layer 11, for example, the active surface of the circuit layer 11 is closer to the front surface 1A than to the back surface 1B of the die 1.

Under such arrangement, the bulk silicon portion of the die 1 is replaced with the encapsulant 14. Accordingly, the die 1 may effectively avoid parasitic surface conduction which may be conducted through the path of the silicon layer and the silicon oxide layer. The die 1 may be manufactured by a half-cut operation as will be described in FIG. 5A to FIG. 5J of present disclosure.

Figure 1B:
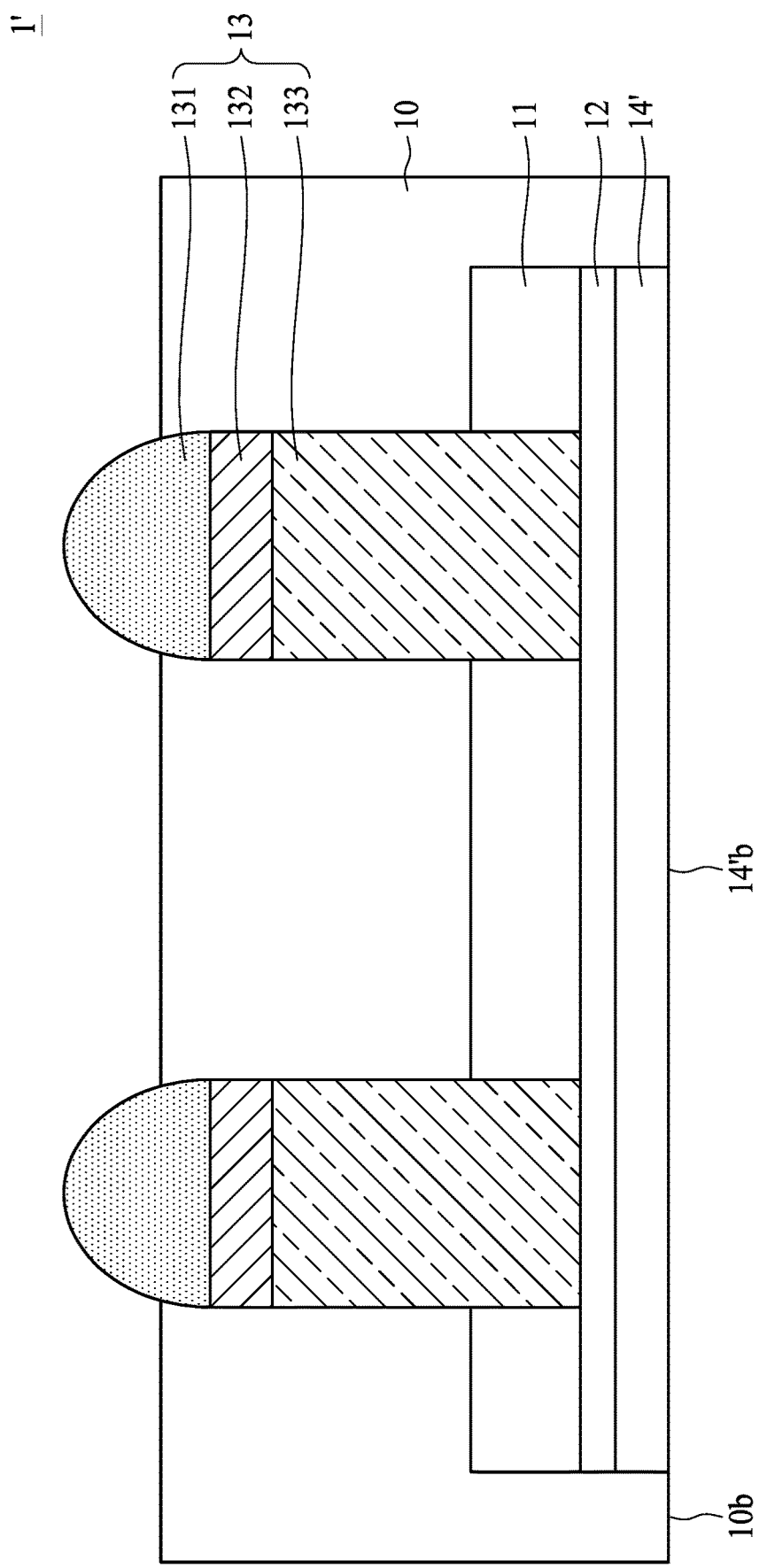
FIG. 1B illustrates a cross-sectional view of a die according to some embodiments of the present disclosure.

FIG. 1B is a cross-sectional view of a die 1' in accordance with some embodiments of the present disclosure. The die 1' is similar to the die 1 in FIG. 1A except that an encapsulant 14' is embedded in the encapsulant 10. The encapsulant 14' has a back surface 14'b. The encapsulant 10 has a back surface 10b. The back surface 14'b and the back surface 10b are substantially coplanar with each other. A thickness of such arrangement of the die 1' would be thinned.

Figure 2:
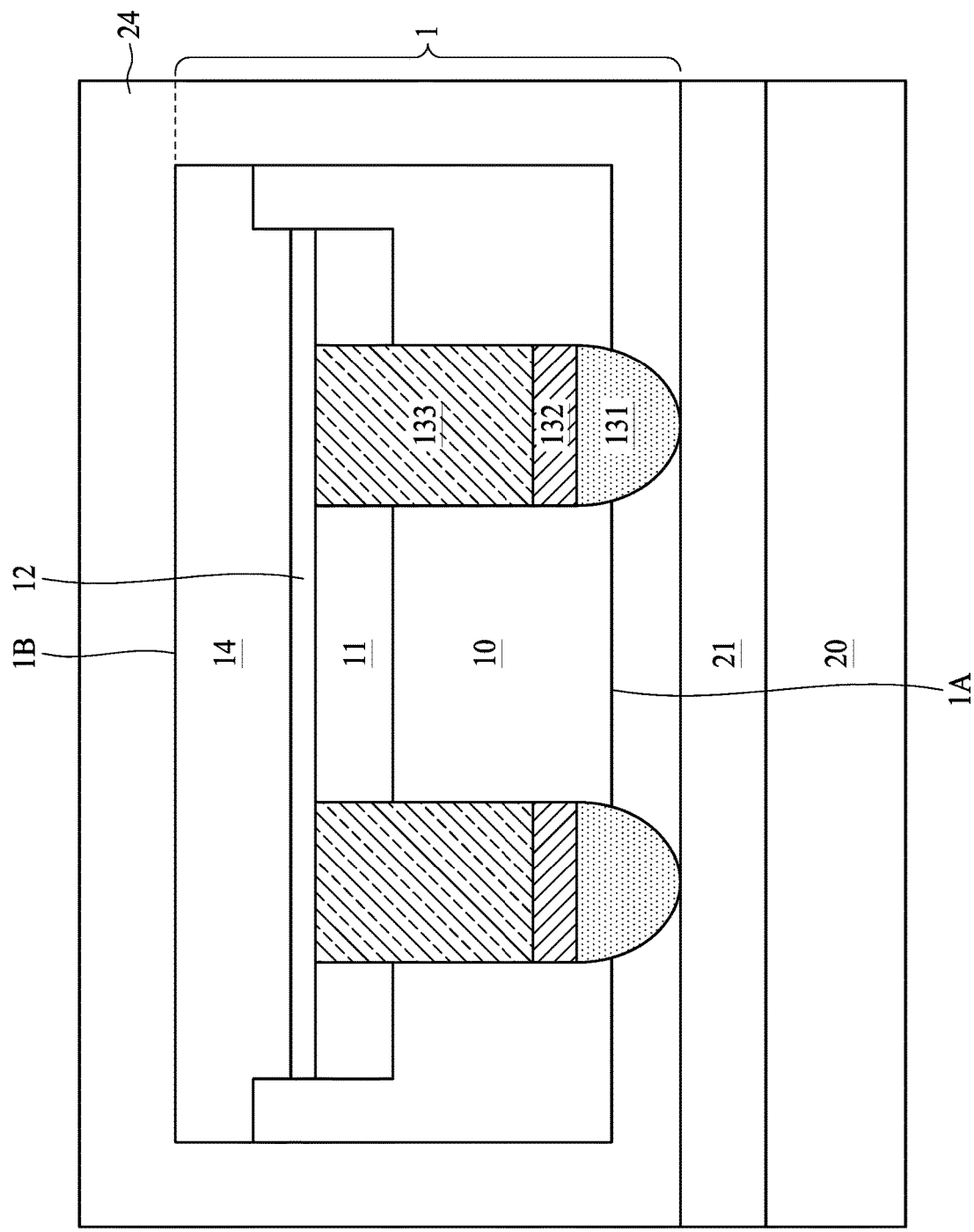
FIG. 2 illustrates a cross-sectional view of a semiconductor package structure according to some embodiments of the present disclosure.

FIG. 2 is a cross-sectional view of a semiconductor package structure 2 in accordance with some embodiments of the present disclosure. The semiconductor package structure 2 includes a substrate 20, a redistribution layer (RDL) 21, the die 1, and an encapsulant 24.

The substrate 20 may be or include, for example, a printed circuit board, such as a paper-based copper foil laminate, a composite copper foil laminate, or a polymer-impregnated glass-fiber-based copper foil laminate. The substrate 20 may include a core layer which is made of a bismaleimide-triazine (BT) resin or a glass-reinforced epoxy composite (e.g., an FR-4 composite). In some embodiments, the grounding element is a via that is exposed from a lateral surface of the substrate 20. In some embodiments, the grounding element is a metal layer exposed from the lateral surface of the substrate 20. In some embodiments, the grounding element is a metal trace exposed from the lateral surface of the substrate 20. The RDL 21 is disposed between the substrate 20 and the die 1. In some embodiments, the substrate 20 may be omitted. The RDL 21 may function as a carrier.

The die 1 is reversely disposed on the RDL 21. The die 1 is electrically connected to the substrate 20. The die 1 includes an antenna structure. The antenna structure includes the circuit layer 11, the insulating layer 12, and the conductive element 13.

In some embodiments, the semiconductor package structure 2 may include another die 1. The two dies are disposed in parallel. The active surfaces of the circuit layers 11 of the two dies are not coplanar with each other. The insulating layers 12 of the two dies misalign to each other. The interfaces between the encapsulants 14 and the insulating layers 12 of the two dies are not coplanar.

The encapsulant 24 is disposed between the substrate 20 and the front surface 1A of the die 1. The encapsulant 24 is disposed over the encapsulant 14. The encapsulant 14 is disposed over the antenna structure. The encapsulant 24 is in contact with the front surface 1A of the die 1. The encapsulant 24 is in contact with the encapsulant 10 proximal to the front surface 1A. The encapsulant 24 is in contact with the encapsulant 14 proximal to the back surface 1B. The encapsulant 24 and the encapsulant 10 are between the circuit layer 11 and the substrate 20. The encapsulant 14 and the encapsulant 24 are disposed over a vertical projection area of the antenna structure. In some embodiments, the encapsulant 24 may function as a package encapsulant.

The encapsulant 24 encapsulates the die 1. There is an interface between the encapsulant 10 and the encapsulant 24. There is an interface between the encapsulant 14 and the encapsulant 24. In some embodiments, the materials of the encapsulant 10, the encapsulant 14, and the encapsulant 24 may be the same or different.

The conductive element 13 electrically connects the circuit layer 11 to the RDL 21. The conductive element 13 is a portion of the antenna structure. The conductive element 13 extends from the circuit layer 11 to the RDL 21. That is, the conductive element 13 may extend from the active surface of the die 1 to the RDL 21.

Figure 3:
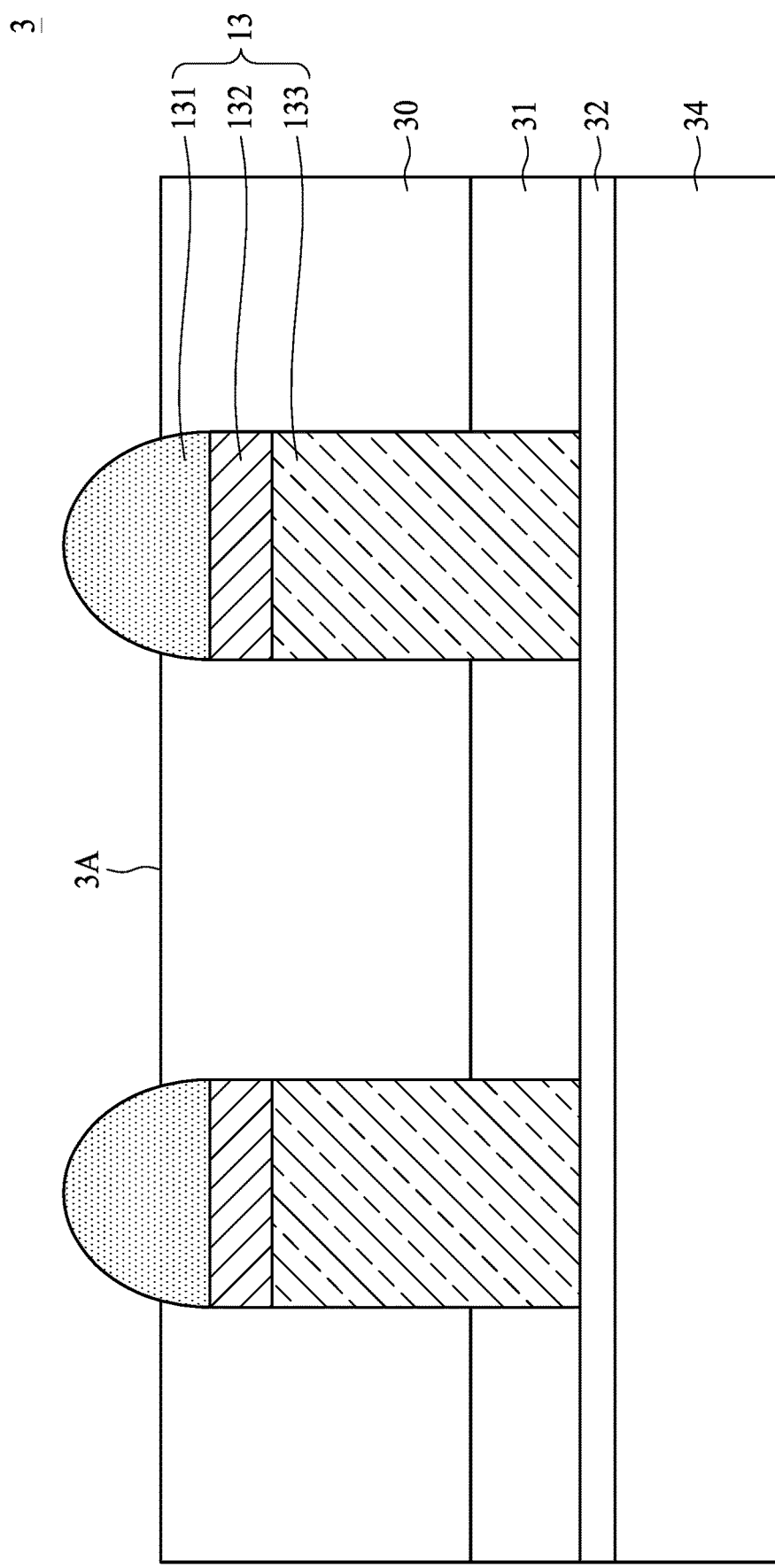
FIG. 3 illustrates a cross-sectional view of a die according to some embodiments of the present disclosure.

FIG. 3 is a cross-sectional view of a die 3 in accordance with some embodiments of the present disclosure. The die 3 is similar to the die 1 in FIG. 1A except that a circuit layer 31 and an insulating layer 32 cover an entire width of the encapsulant 34. The die 3 may be manufactured by a full-cut operation as will be described in FIG. 6A to FIG. 6I of present disclosure.

The die 3 has a front surface 3A and a back surface 3B opposite to the front surface 3A. The encapsulant 30 is disposed on the circuit layer 31. A side surface of the encapsulant 30 and a side surface of the encapsulant 34 are substantially coplanar. The side surface of the encapsulant 30 and a side surface of the circuit layer 31 are substantially coplanar. The side surface of the circuit layer 31 and a side surface of the insulating layer 32 are substantially coplanar.

Figure 4A:
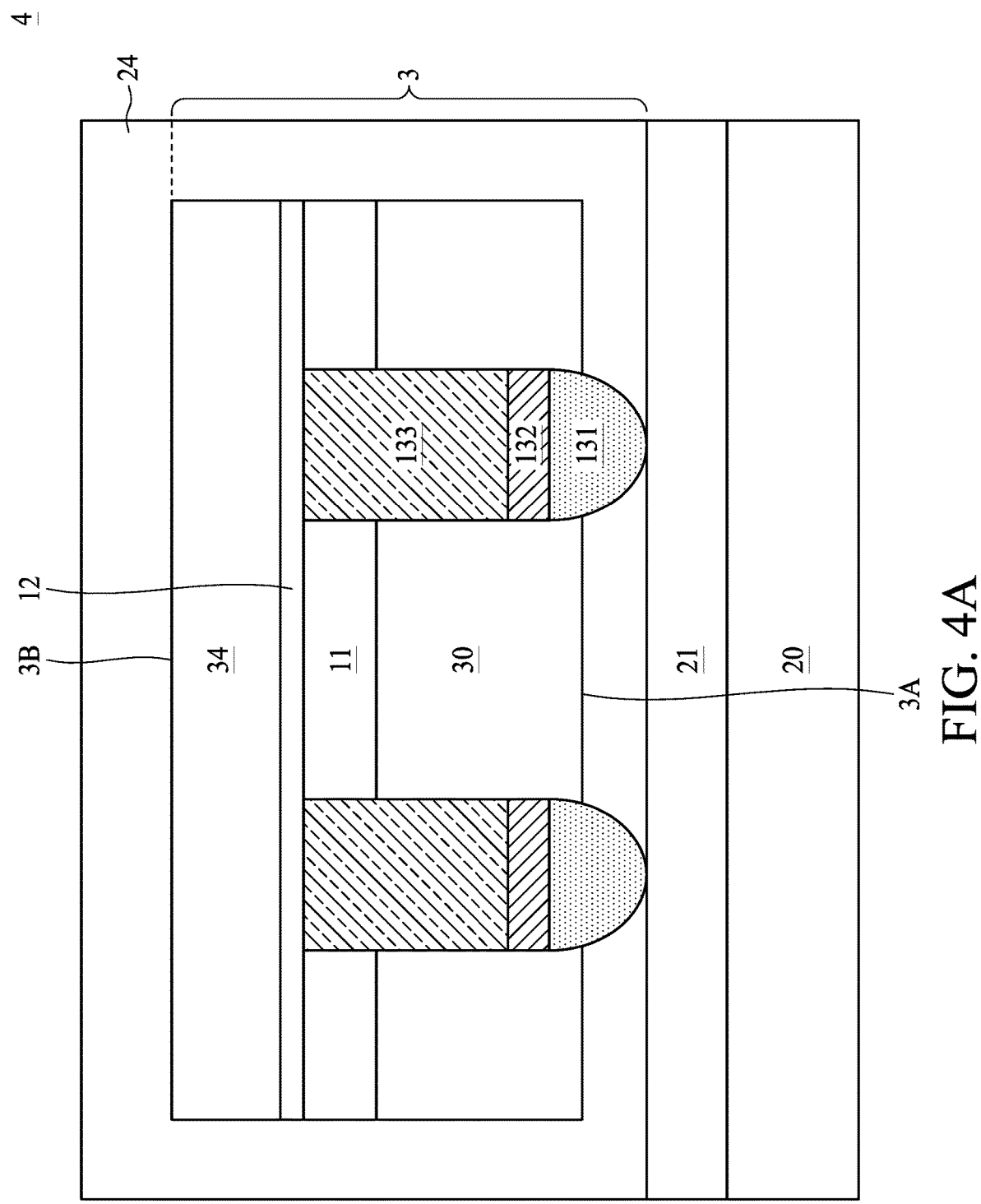
FIG. 4A illustrates a cross-sectional view of a semiconductor package structure according to some embodiments of the present disclosure.

FIG. 4A is a cross-sectional view of a semiconductor package structure 4 in accordance with some embodiments of the present disclosure. The semiconductor package structure 4 is similar to the semiconductor package structure 2 in FIG. 2 except that the die 1 is replaced with the die 3.

Figure 4B:
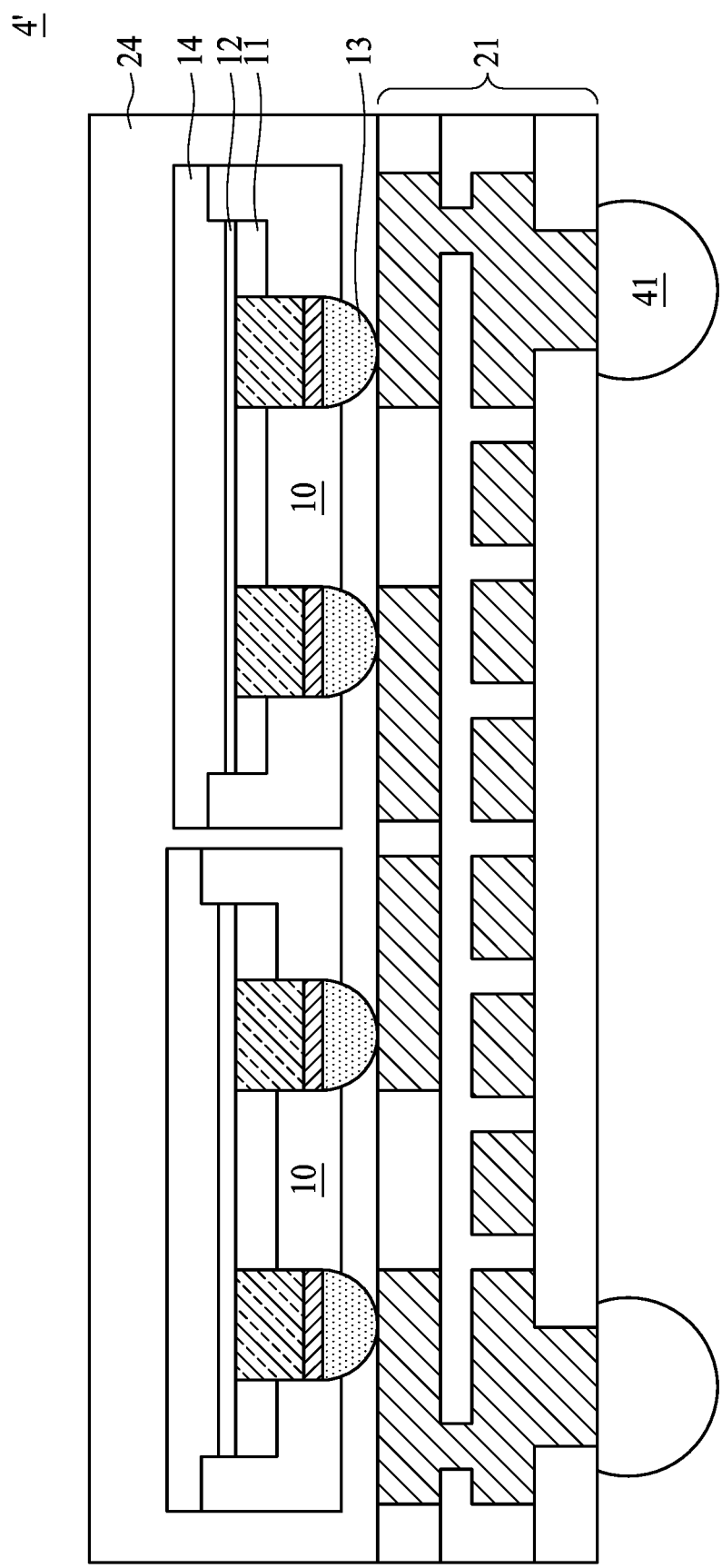
FIG. 4B illustrates a cross-sectional view of a semiconductor package structure according to some embodiments of the present disclosure.

FIG. 4B is a cross-sectional view of a semiconductor package structure 4' in accordance with some embodiments of the present disclosure. The semiconductor package structure 4' is similar to the semiconductor package structure 2 of FIG. 2 except that the semiconductor package structure 4' includes multiple dies and multiple solder balls. The semiconductor package structure 4' includes an encapsulant 10, a circuit layer 11, an insulating layer 12, a conductive element 13, an encapsulant 14, a RDL 21, an encapsulant 24, and a solder ball 41. The circuit layer 11, the insulating layer 12, and the conductive element 13 may be an antenna structure. The antenna structure, the encapsulant 10, and the encapsulant 24 are included in a die. The encapsulant 10 is in contact with the encapsulant 14 and the encapsulant 24. The antenna structure may be manufactured by a half-cut operation.

The antenna structure is disposed on the RDL 21. The antenna structure is encapsulated by the encapsulant 10. The antenna structure is encapsulated by the encapsulant 24. The encapsulant 14 covers the antenna structure. The encapsulant 10 and 24 are disposed on the RDL 21. The encapsulant 10 is disposed between the RDL 21 and the antenna structure. The encapsulant 10 is disposed between the RDL 21 and the encapsulant 24. The encapsulant 10 covers the antenna structure. The encapsulant 24 surrounds the antenna structure. The encapsulant 24 encapsulates the die. The conductive element 13 of the antenna structure electrically connects the circuit layer 11 to the solder ball 41 through the RDL 21. In some embodiments, the materials of the encapsulant 10, the encapsulant 14, and the encapsulant 24 may be the same or different.

Since the two antenna structures in FIG. 4B are respectively pick-and-place to dispose on the RDL 21, in some embodiments, two antenna structures of two dies may perform identical or different functions. The two antenna structures are disposed in parallel. The active surfaces of the circuit layers 11 of the two adjacent antenna structures may not be laterally aligned to each other. The insulating layers 12 of the two antenna structures may have different thicknesses. The interfaces between the encapsulants 14 and the insulating layers 12 of the two antenna structures may not be laterally aligned.

Figure 4C:
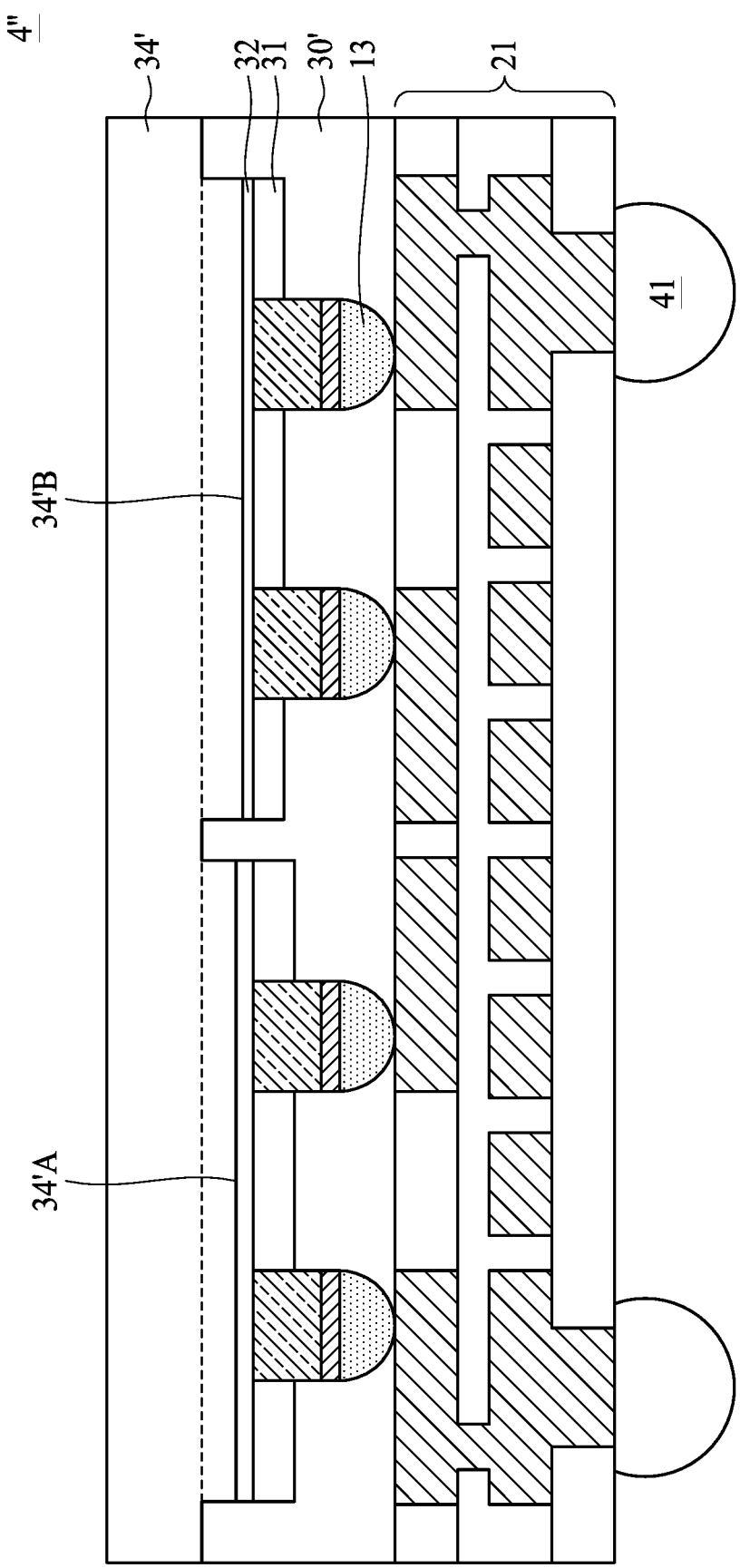
FIG. 4C illustrates a cross-sectional view of a semiconductor package structure according to some embodiments of the present disclosure.

FIG. 4C is a cross-sectional view of a semiconductor package structure 4" in accordance with some embodiments of the present disclosure. The semiconductor package structure 4" includes an encapsulant 30', a circuit layer 31, an insulating layer 32, a conductive element 13, an encapsulant 34', a RDL 21, and a solder ball 41. The circuit layer 31, the insulating layer 32, and the conductive element 13 may be an antenna structure. The antenna structure may be manufactured by a full-cut operation.

The antenna structure is disposed on the RDL 21. The encapsulant 34' covers the antenna structure and the encapsulant 30'. The encapsulant 30' is disposed on the RDL 21. The encapsulant 30' is disposed between the RDL 21 and the antenna structure. The encapsulant 30' encapsulates the antenna structure. The conductive element 13 of the antenna structure electrically connects the circuit layer 11 to the solder ball 41 through the RDL 21.

Since the two antenna structures in FIG. 4B are respectively pick-and-place to dispose on the RDL 21, in some embodiments, two antenna structures may perform identical or different functions. The two antenna structures are disposed in parallel. The active surfaces of the circuit layers 31 of the two adjacent antenna structures may not be laterally aligned to each other. The insulating layers 32 of the two antenna structures may have different thicknesses. The interfaces between the encapsulant 34' and the insulating layers 32 of the two antenna structures may not be laterally aligned.

The encapsulant 34' as a uniform contiguous material includes a step feature. The encapsulant 34' is in contact with the encapsulant 30'. The encapsulant 34' is in contact with the two antenna structures. The encapsulant 34' has a surface 34'A and a surface 34'B. The surface 34'A and the surface 34'B are in contact with back surfaces of the insulating layers 32 of the two antenna structures.

The difference between the semiconductor package structure 4" and the semiconductor package structure 4 of FIG. 4A is that the antenna structure of the semiconductor package structure 4" is encapsulated by the encapsulants 30' and 34' without the encapsulant 24. Accordingly, since the encapsulant 24 is omitted, the cost may decrease.

FIG. 5A through FIG. 5J illustrate some embodiments of a method of manufacturing a semiconductor package structure 4' according to some embodiments of the present disclosure. Various figures have been simplified to more clearly present aspects of the present disclosure. Such method is directed to a half-cut operation.

Figure 5A:
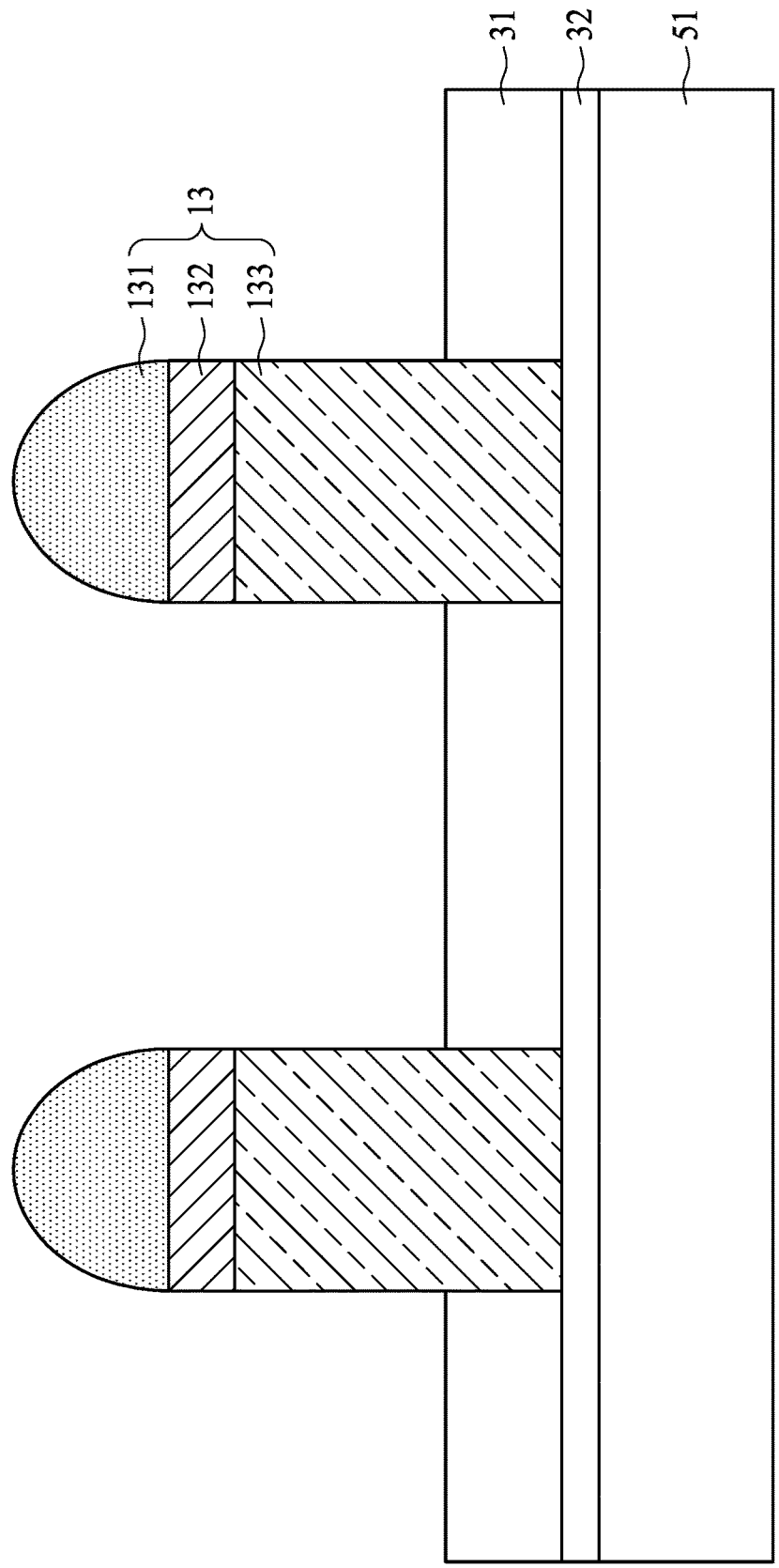
FIG. 5A, FIG. 5B, FIG. 5C, FIG. 5D, FIG. 5E, FIG. 5F, FIG. 5G, FIG. 5H, FIG. 5I, and FIG. 5J illustrate intermediate operations of a method for manufacturing a semiconductor package structure according to some embodiments of the present disclosure.

Referring to FIG. 5A, the method for manufacturing the semiconductor package structure 1 includes providing a wafer 5. The wafer 5 includes a silicon layer 51, an insulating layer 32, a circuit layer 31, and a conductive element 13. The conductive element 13 includes a conductive material 131, a conductive layer 132, and a conductive post 133. In some embodiments, the conductive material 131 may include solder (Sn) or other suitable materials. The conductive layer 132 may include nickel (Ni) or other suitable materials. The conductive post 133 may include copper (Cu) or other suitable materials. The circuit layer 31, the insulating layer 32, and the conductive element 13 may be an antenna structure. In some embodiments, the antenna structure may be an antenna tuner.

Figure 5B:
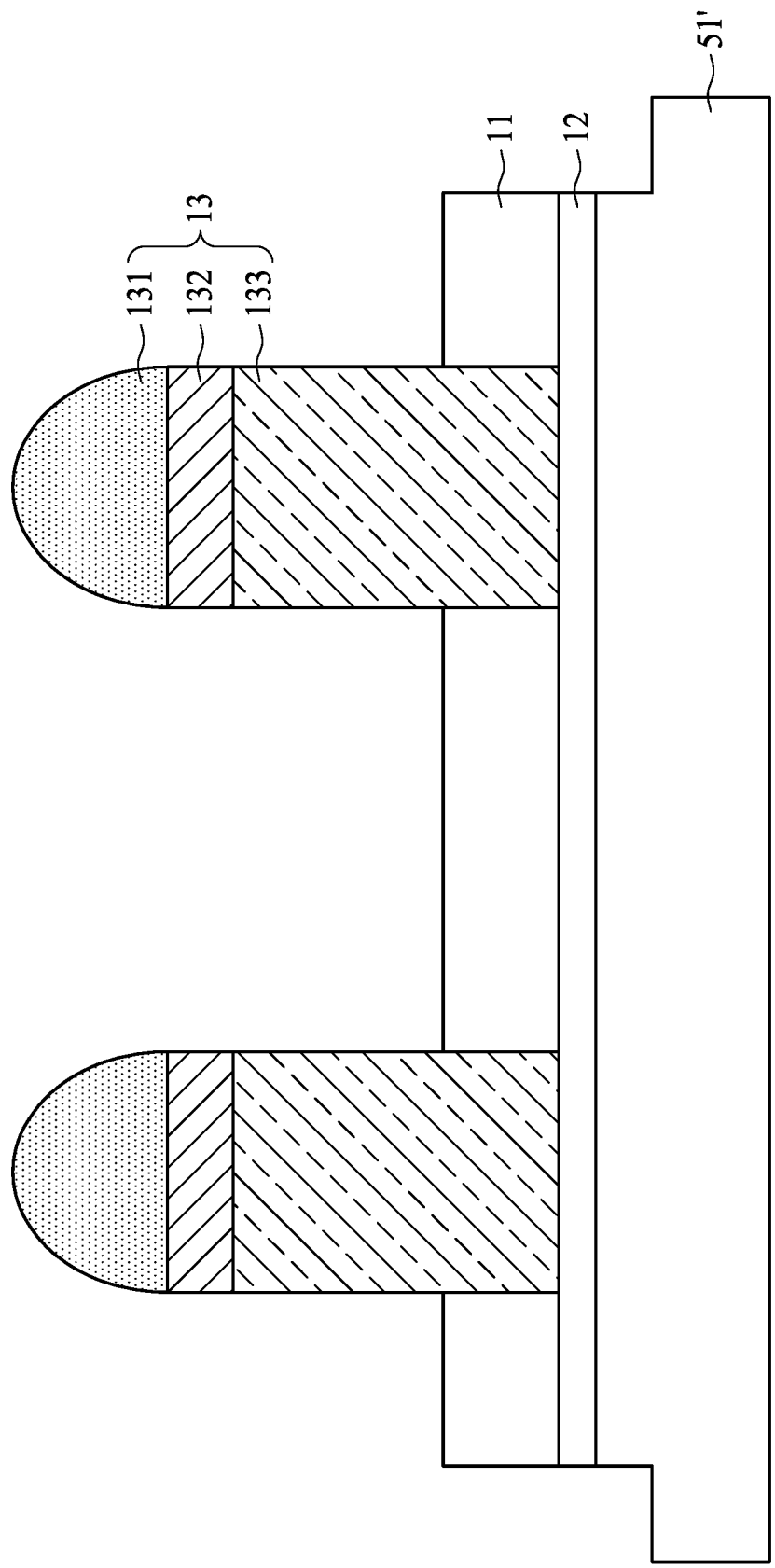

Referring to FIG. 5B, a half-cutting operation is performed to the circuit layer 31 and the insulating layer 32 to form a cut circuit layer 11, a cut insulating layer 12, and a cut silicon layer 51'. The half-cutting operation is suitable for fine circuit layers in a wafer. The circuit layer would not be damaged during the half-cutting operation.

Figure 5C:
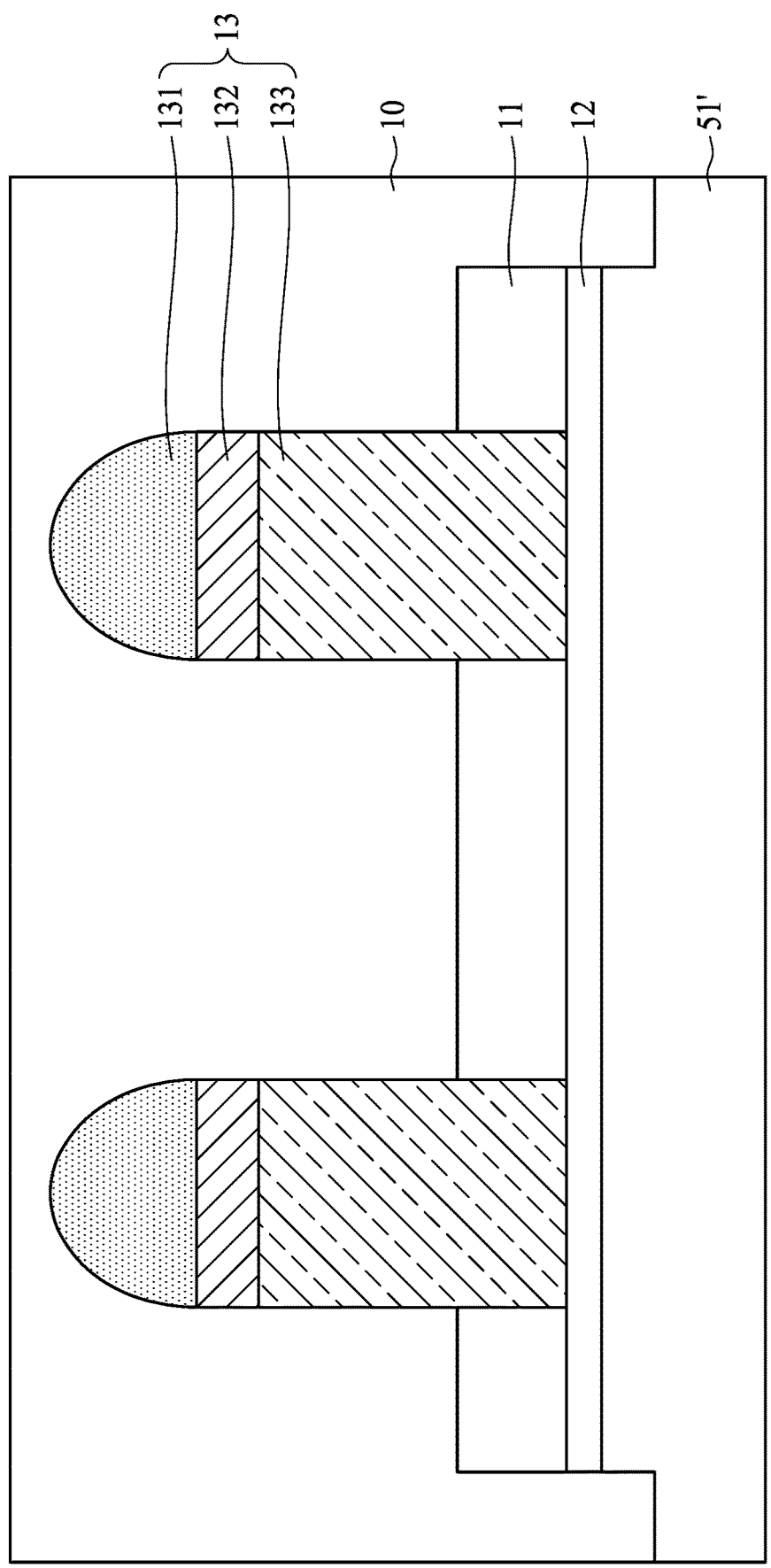

Referring to FIG. 5C, an encapsulant 10 is disposed on the wafer 5 by a molding operation. The encapsulant 10 completely encapsulates the antenna structure. The molding operation is a first molding operation.

Figure 5D:
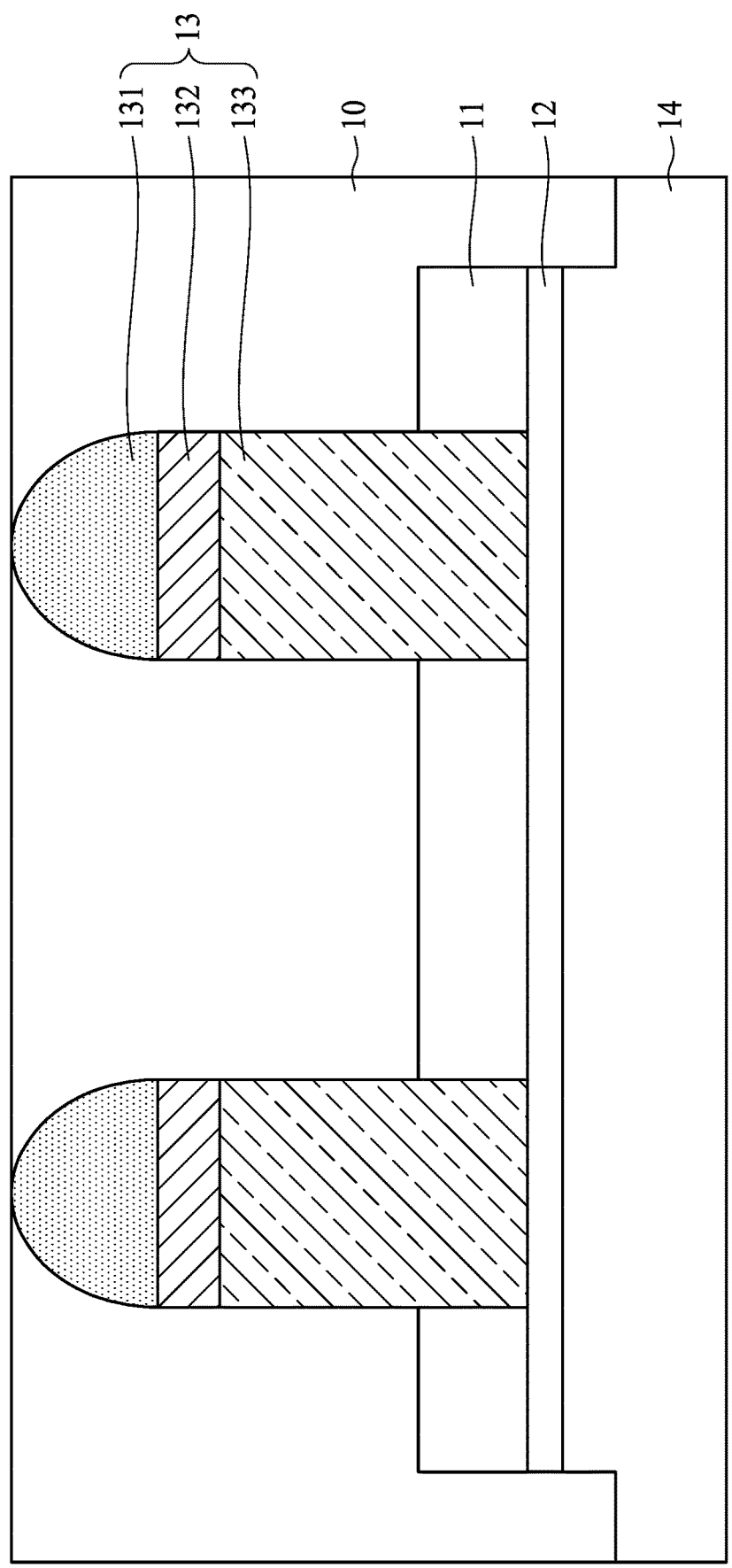

Referring to FIG. 5D, the cut silicon layer 51' is completely removed by an etching operation. Subsequently, an encapsulant 14 is disposed on the back side of the antenna structure by a molding operation. The encapsulant 14 is in contact with the encapsulant 10 and the insulating layer 12. The materials of the encapsulant 10 and the encapsulant 14 may be identical or different. The molding operation is a second molding operation.

Figure 5E:
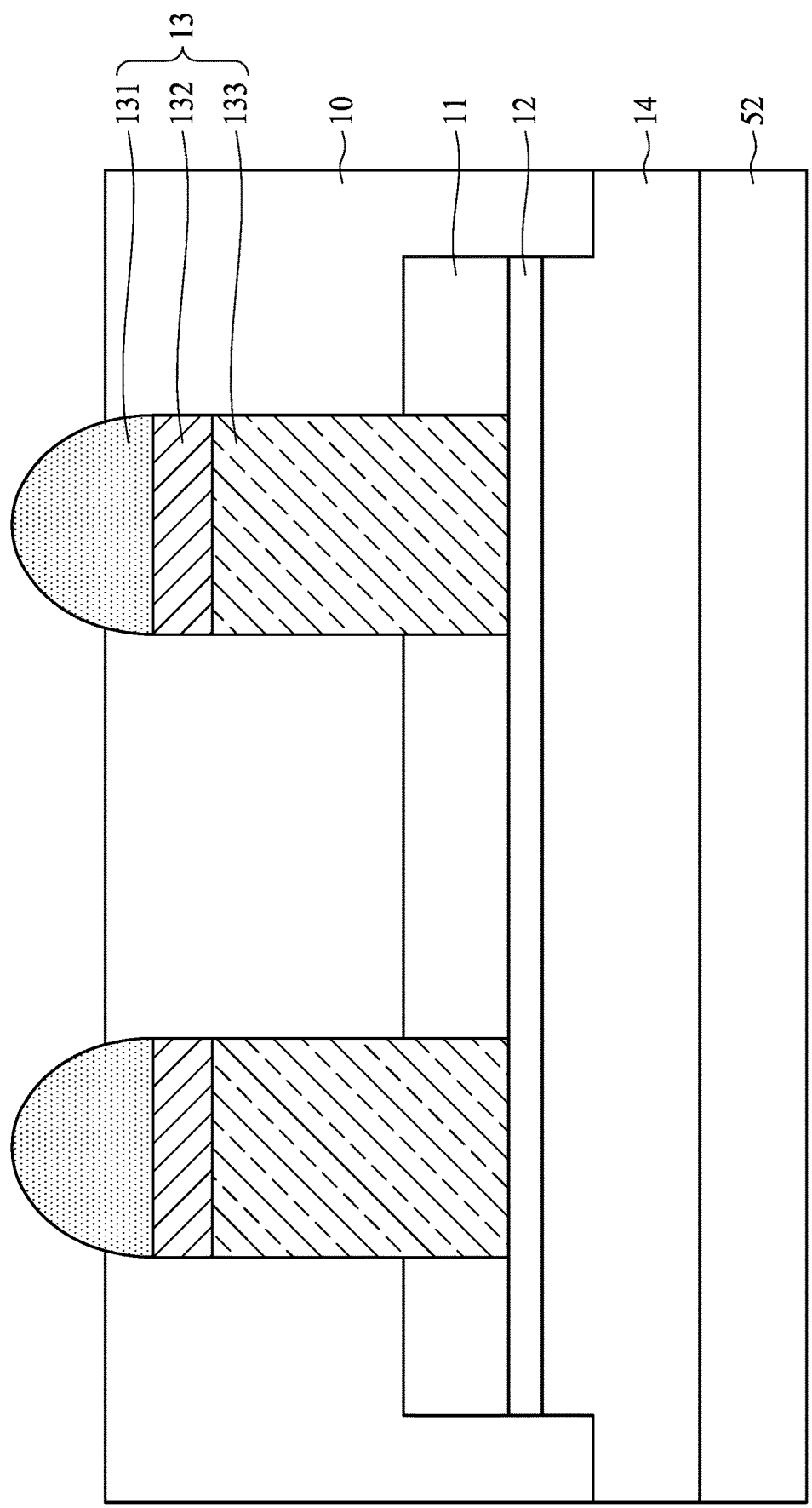

Referring to FIG. 5E, a carrier 52 is bonded to the encapsulant 14. Subsequently, a portion of the encapsulant 10 is removed by a grinding operation. The conductive material 131 is exposed from the encapsulant 10 after the grinding operation.

Figure 5F:
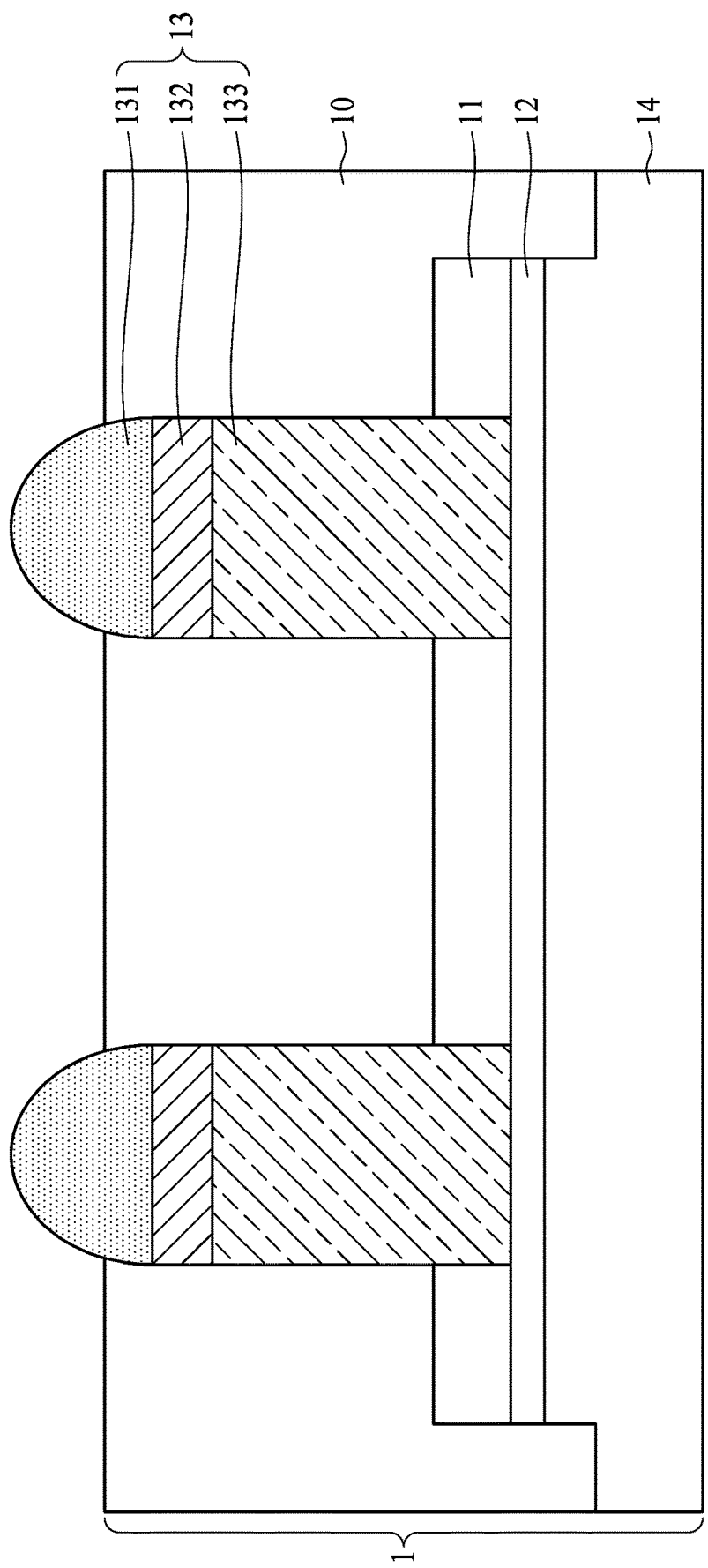

Referring to FIG. 5F, the carrier 52 is removed. Subsequently, the wafer 5 is divided into a plurality of dies 1 by a dicing operation.

Figure 5G:
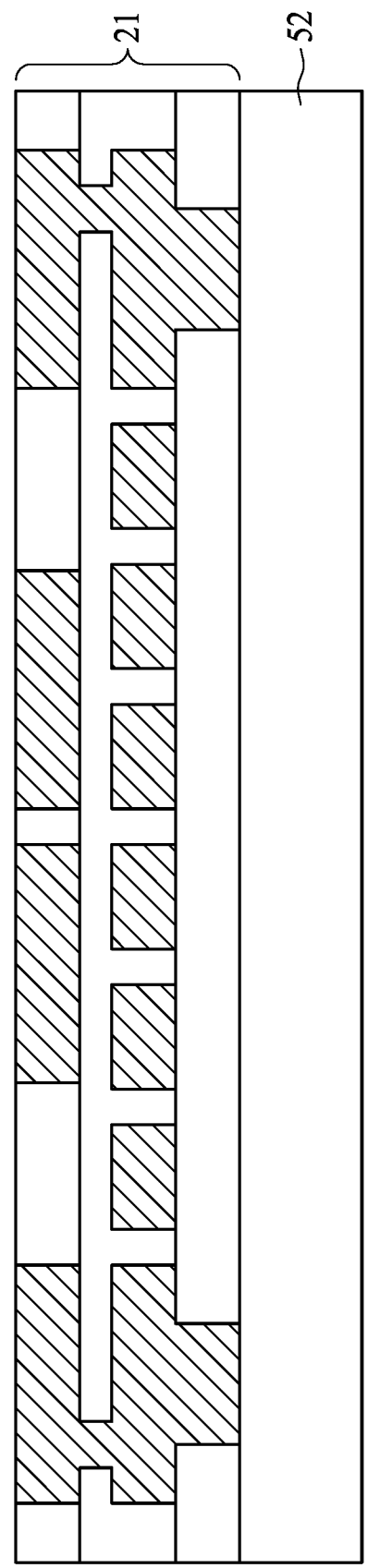

Referring to FIG. 5G, a RDL 21 and a carrier 52 are provided.

Figure 5H:
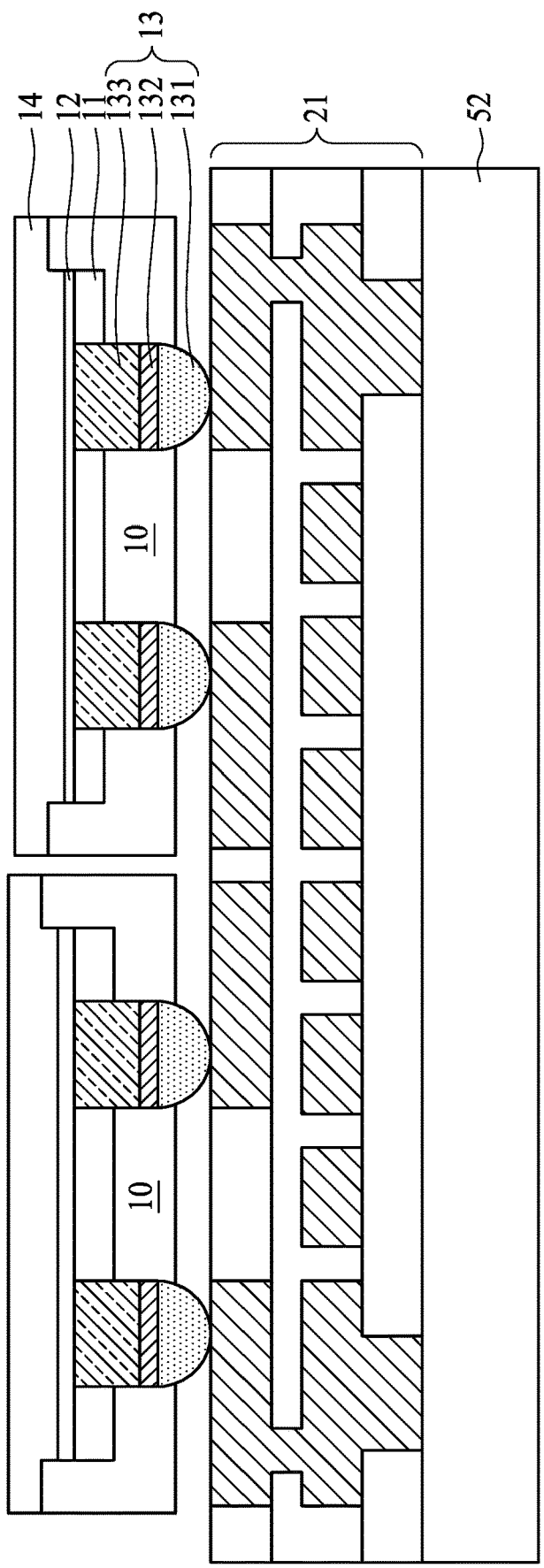

Referring to FIG. 5H, the dies 1 are placed to the RDL 21 in parallel. In some embodiments, the dies 1 may have different thicknesses. Active surfaces of the dies 1 may not be laterally aligned. An interface between the insulating layer 12 and the encapsulant 10 of one die 1 and an interface between the insulating layer 12 and the encapsulant 10 of another die 1 may not be laterally aligned.

Figure 5I:
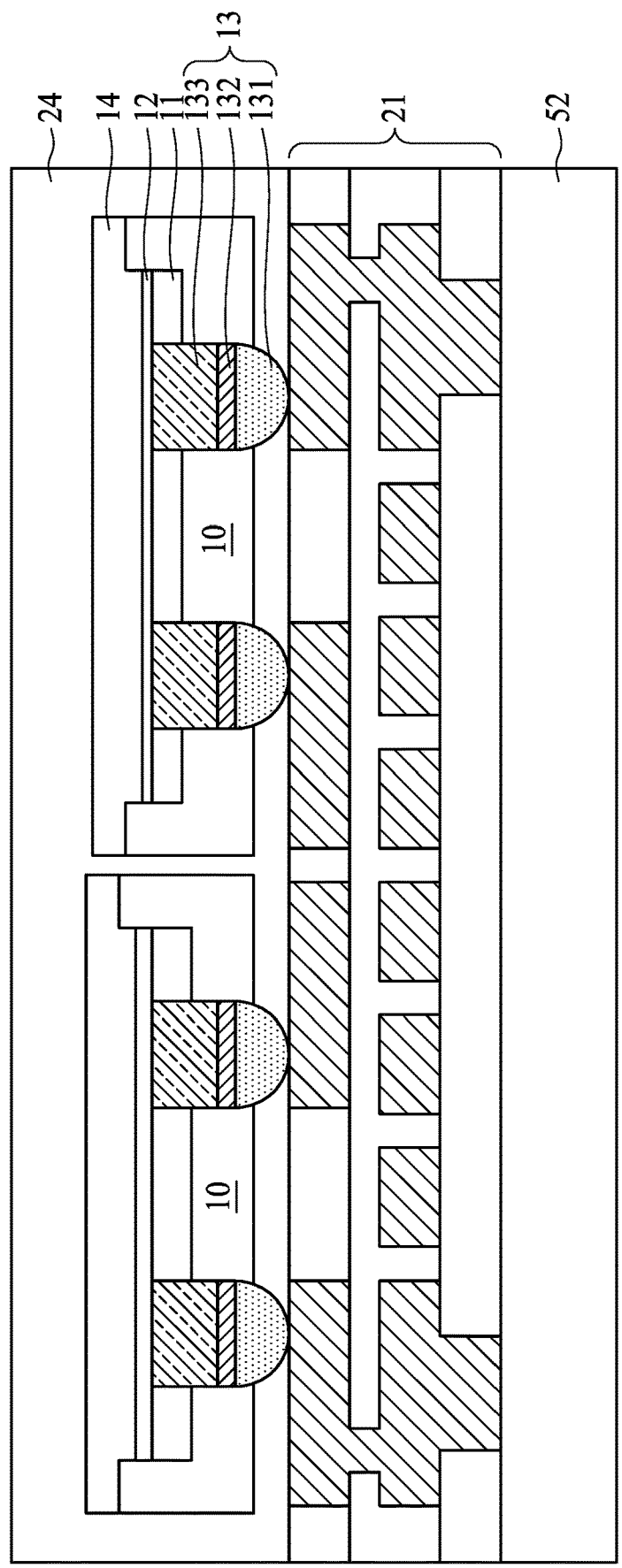

Referring to FIG. 5I, an encapsulant 24 is formed by a molding operation to completely encapsulate the dies 1. The encapsulant 24 is between the encapsulant 10 and the RDL 21. The encapsulant 24 is disposed between the dies 1 and the RDL 21. The molding operation is a third molding operation.

Figure 5J:
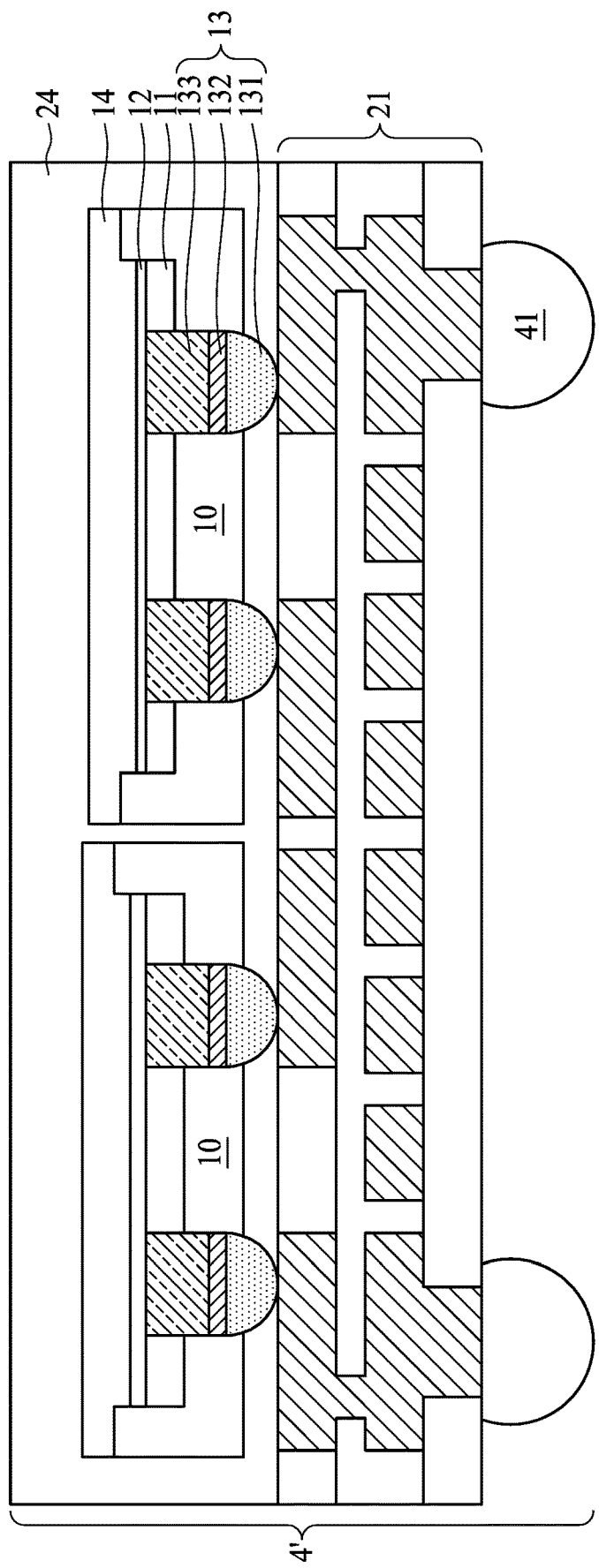

Referring to FIG. 5J, the carrier 52 is removed. A solder ball 41 is attached to the backside of the RDL 21. Subsequently, a dicing operation is performed to form the semiconductor package structure 4'.

FIG. 6A through FIG. 6I illustrate some embodiments of a method of manufacturing a semiconductor package structure 4" according to some embodiments of the present disclosure. Various figures have been simplified to more clearly present aspects of the present disclosure. Such method is directed to full-cutting operations.

Figure 6A:
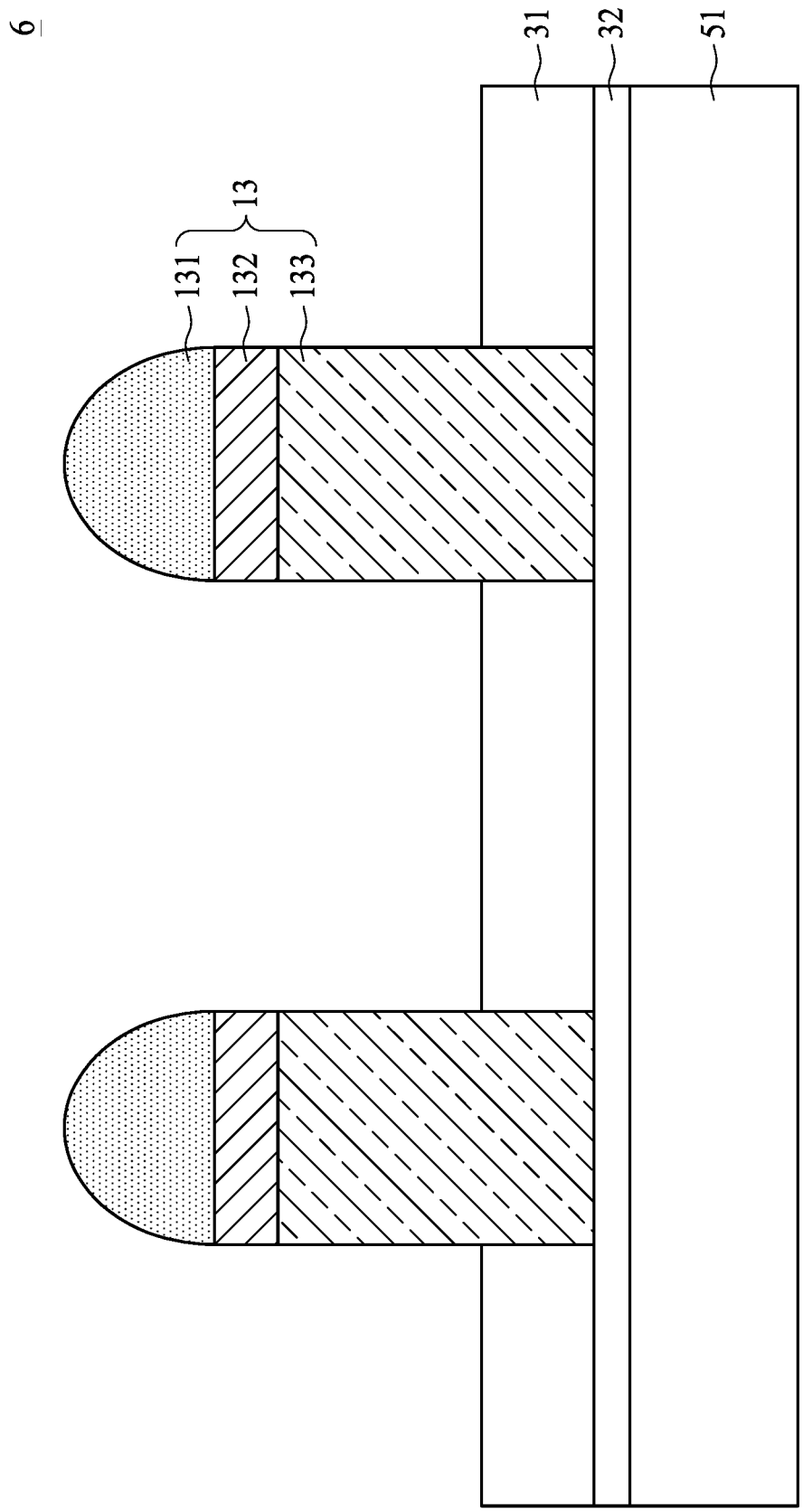
FIG. 6A, FIG. 6B, FIG. 6C, FIG. 6D, FIG. 6E, FIG. 6F, FIG. 6G, FIG. 6H, and FIG. 6I illustrate intermediate operations of a method for manufacturing a semiconductor package structure according to some embodiments of the present disclosure.

Referring to FIG. 6A, the method for manufacturing the semiconductor package structure 1 includes providing a wafer 6. The wafer 6 includes a silicon layer 51, an insulating layer 32, a circuit layer 31, and a conductive element 13. The conductive element 13 includes a conductive material 131, a conductive layer 132, and a conductive post 133. In some embodiments, the conductive material 131 may include solder (Sn) or other suitable materials. The conductive layer 132 may include nickel (Ni) or other suitable materials. The conductive post 133 may include copper (Cu) or other suitable materials. The circuit layer 31, the insulating layer 32, and the conductive element 13 may be an antenna structure. In some embodiments, the antenna structure may be an antenna tuner.

Figure 6B:
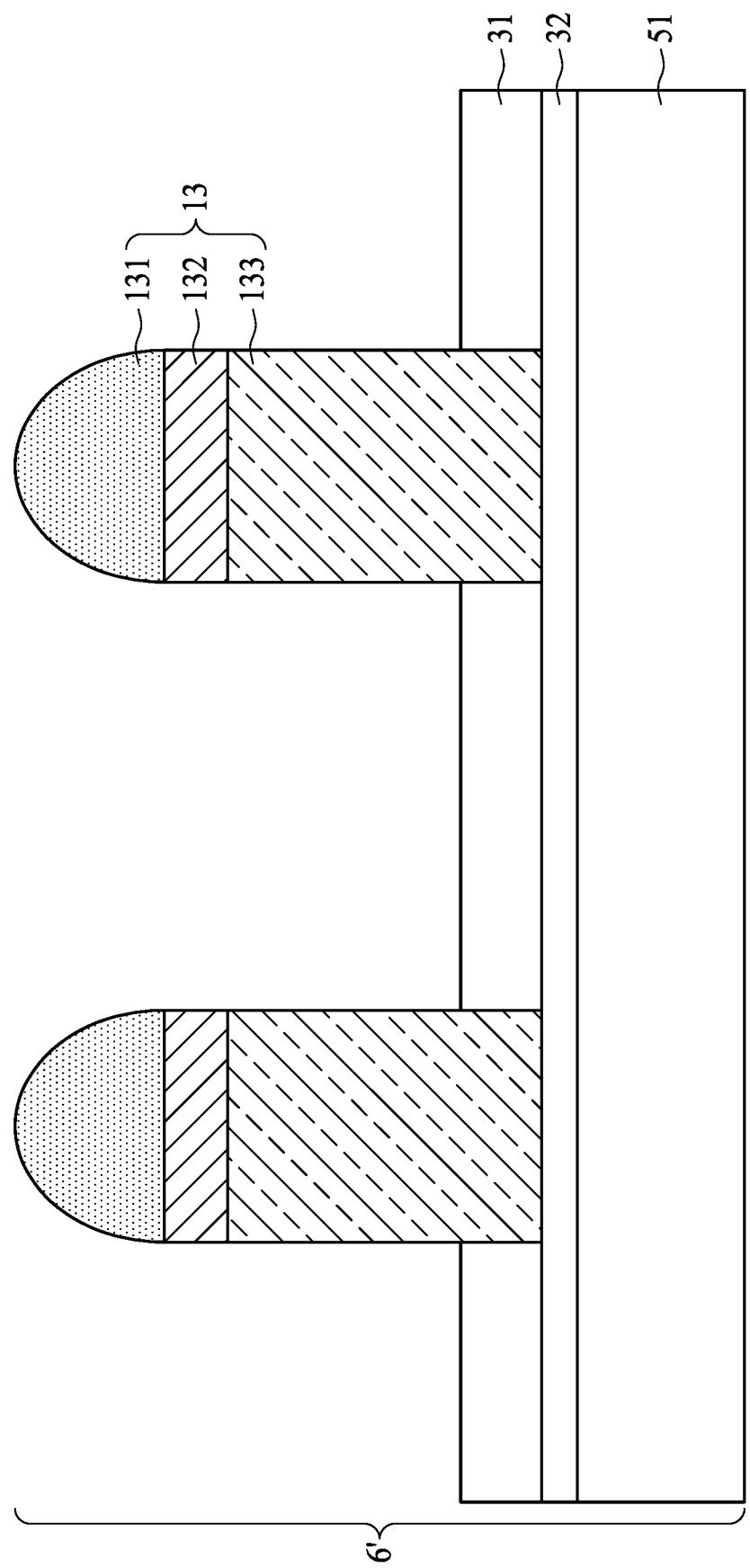

Referring to FIG. 6B, the wafer 6 is divided into a plurality of dies 6' by a cutting operation. The cutting operation may be a full-cut operation. The full-cut operation is suitable for circuit layers with large pitches. Such circuit layers would not be damaged during the full-cut operation. The full-cut operations have fewer operations than the half-cutting operations.

Figure 6C:
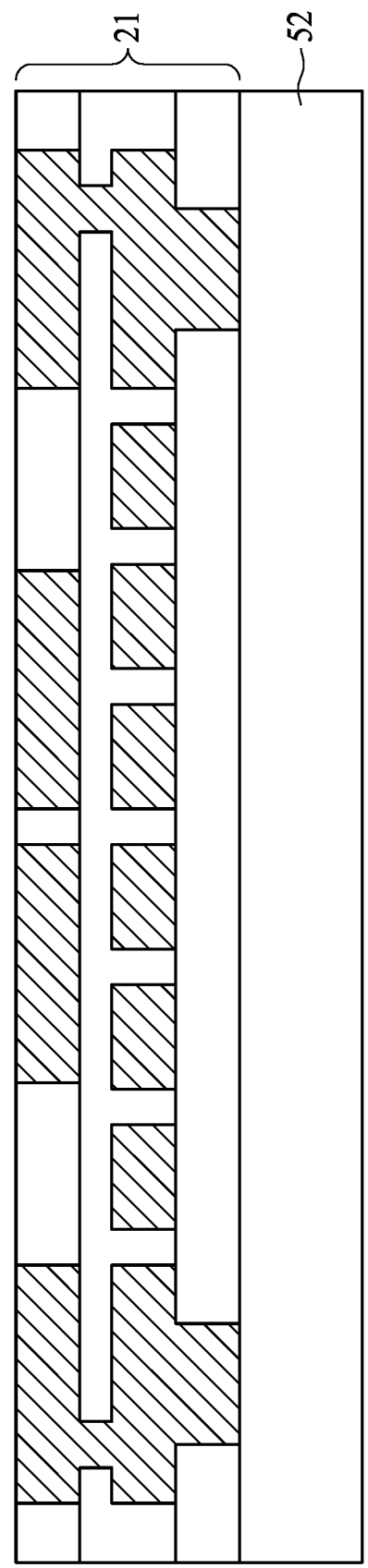

Referring to FIG. 6C, a RDL 21 and a carrier 52 are provided.

Figure 6D:
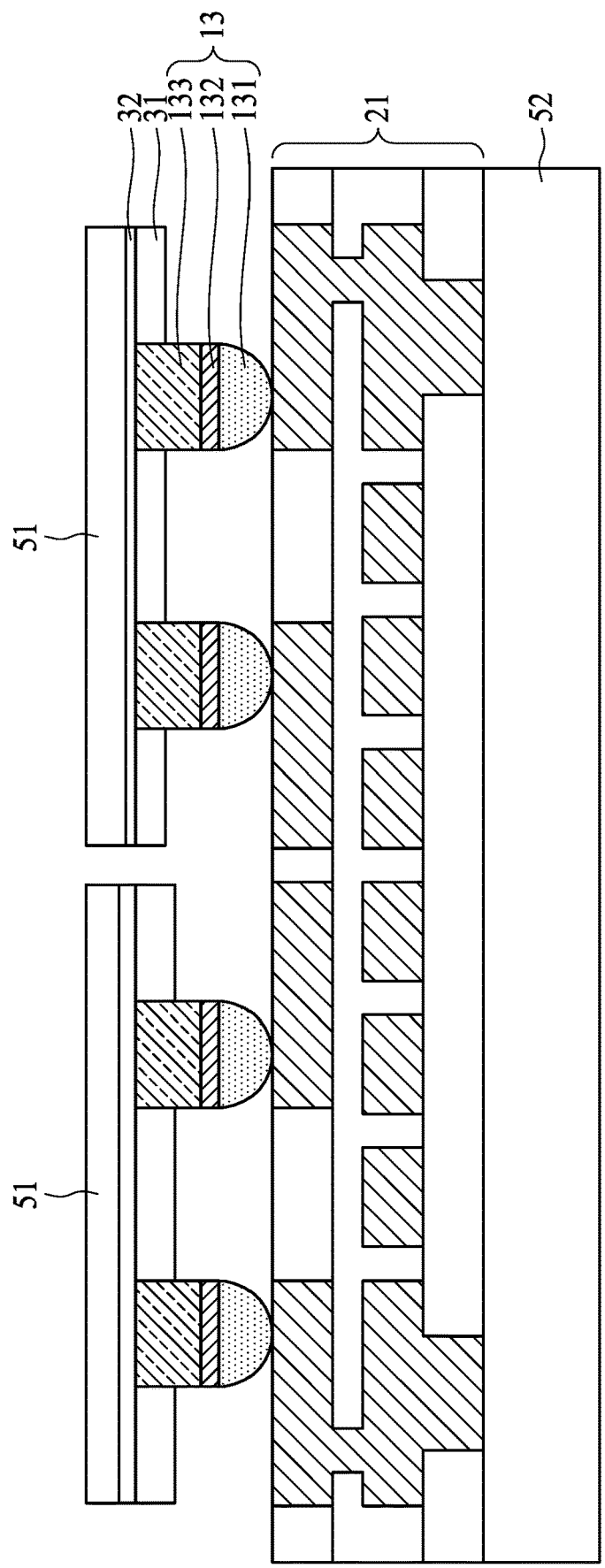

Referring to FIG. 6D, the dies 6' are placed to the RDL 21 individually. Active surfaces of the dies 6' misalign.

Figure 6E:
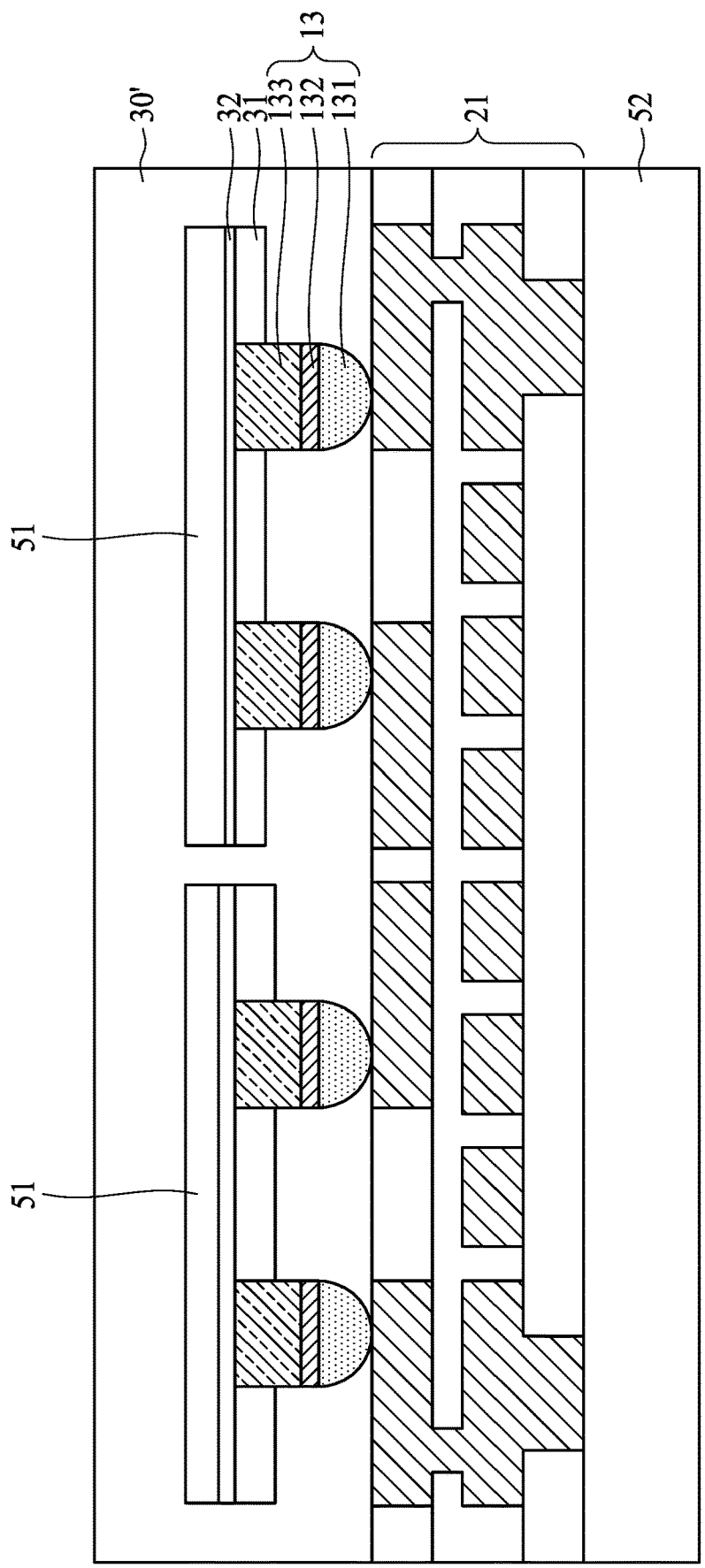

Referring to FIG. 6E, an encapsulant 30' is formed by a molding operation to completely encapsulate the dies 6'. The encapsulant 30' is disposed between the dies 6' and the RDL 21. The molding operation is a first molding operation.

Figure 6F:
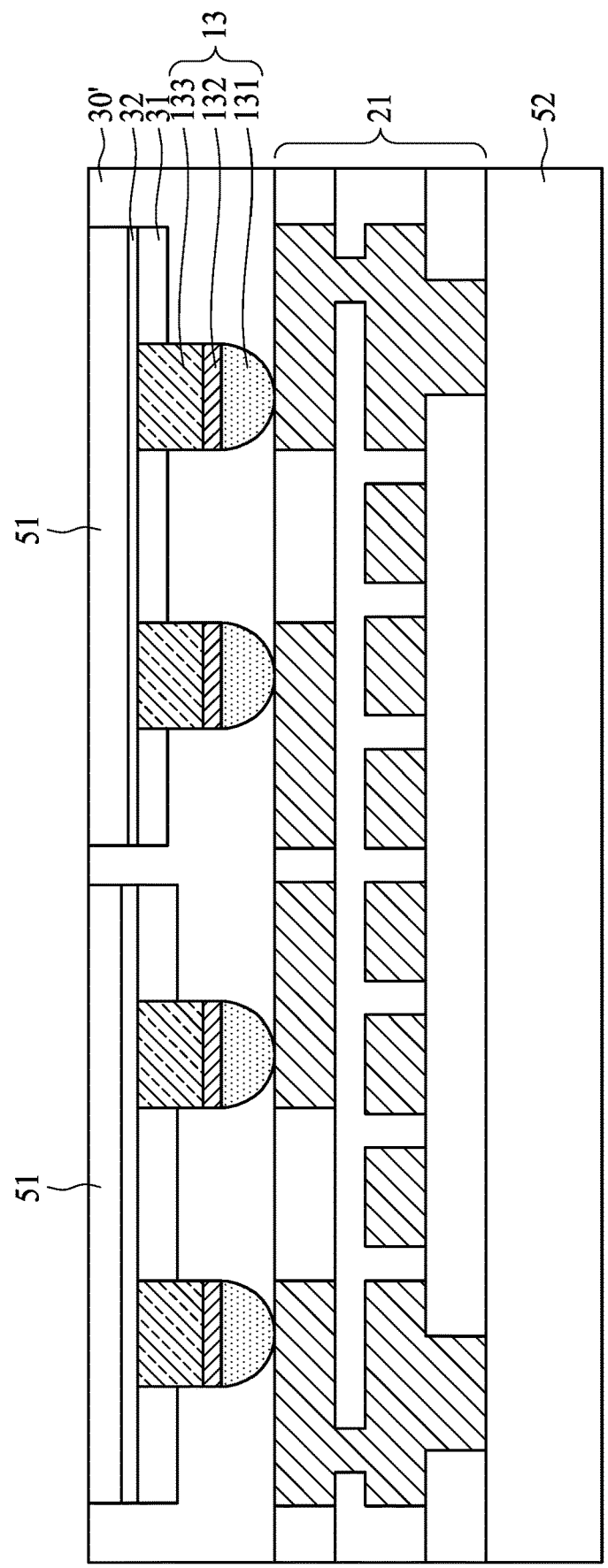

Referring to FIG. 6F, the encapsulant 30' is grinded to expose the silicon layers 51 of the dies 6'.

Figure 6G:
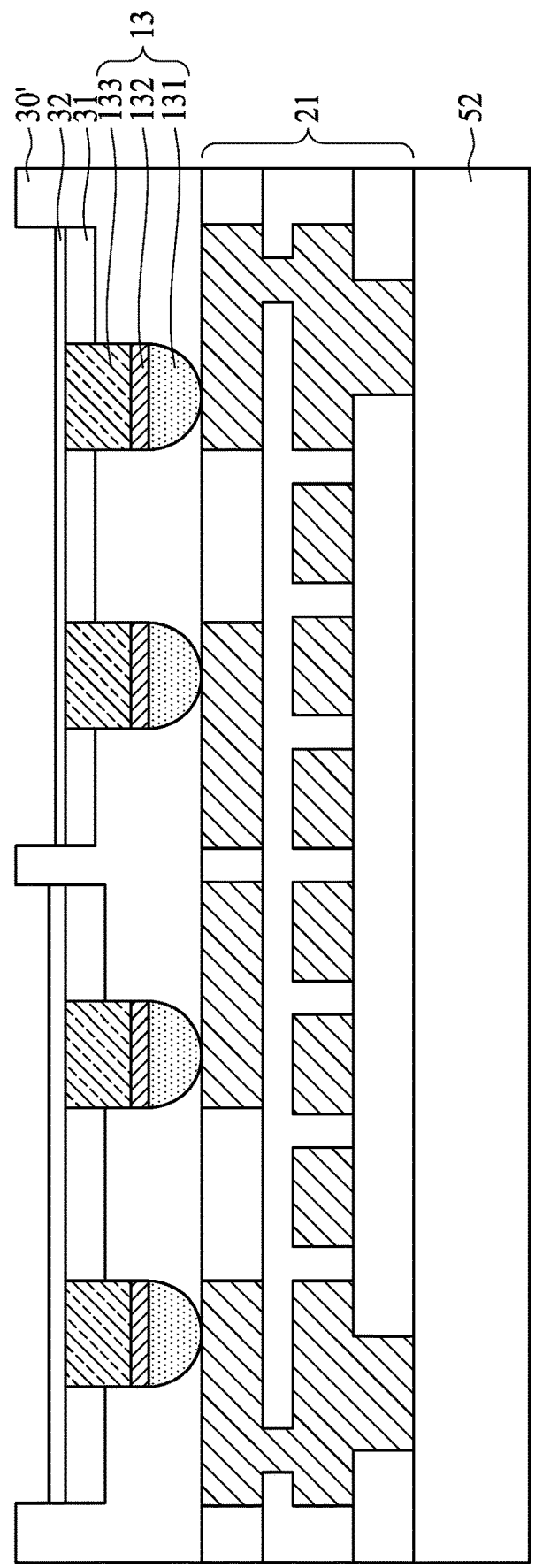

Referring to FIG. 6G, the silicon layers 51 is completely removed by an etching operation. The insulating layer 32 may be exposed to air after the removal of the silicon layers 51.

Figure 6H:
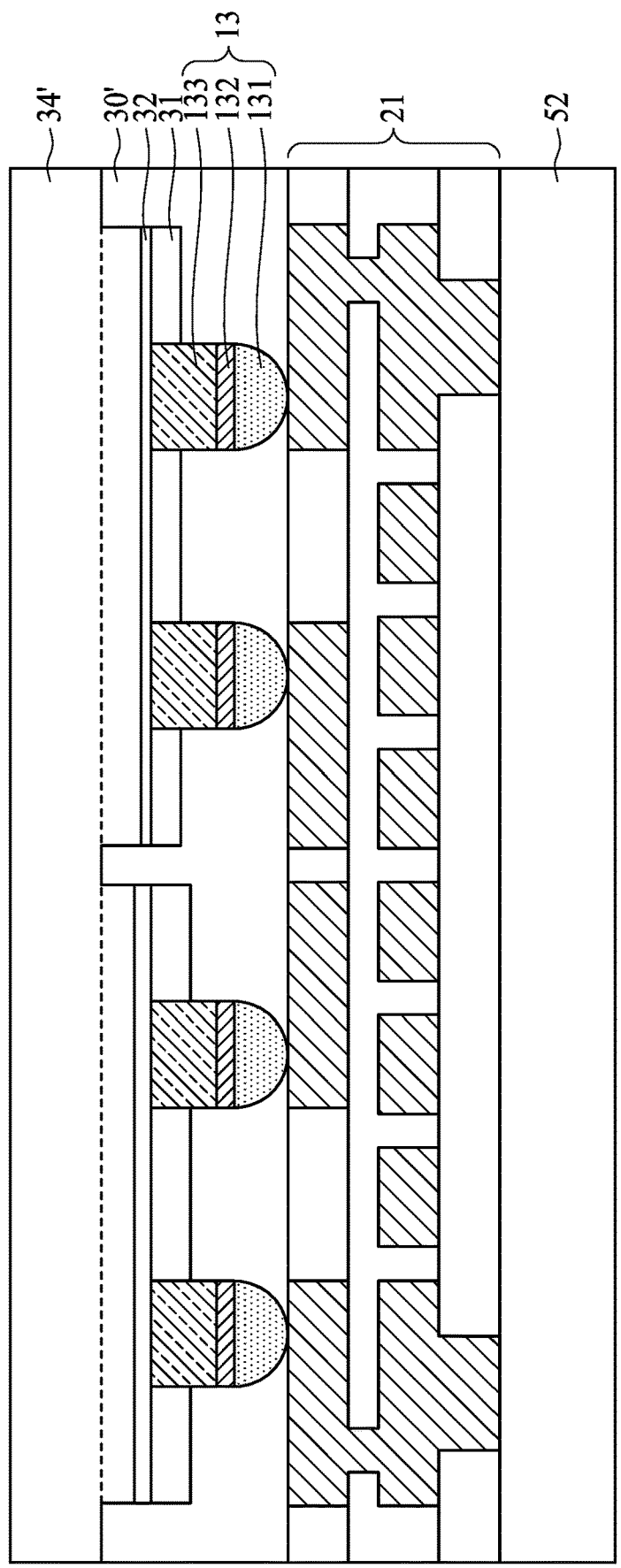

Referring to FIG. 6H, an encapsulant 34' is formed by a molding operation to completely encapsulate the dies 6'. The encapsulant 34' is disposed on the dies 6'. The encapsulant 34' is disposed on the encapsulant 30'. The encapsulant 34 is in contact with the encapsulant 30' and the insulating layer 32. The encapsulant 34' has a step feature. The materials of the encapsulant 30' and the encapsulant 34' may be identical or different. The molding operation is a second molding operation. The dotted line indicates that the silicon layers 51 have been completely removed and replaced with the encapsulant 34'.

In some embodiments, an interface between the insulating layer 32 and the encapsulant 34' of one die and an interface between the insulating layer 32 and the encapsulant 34' of another die may not be laterally aligned.

Figure 6I:
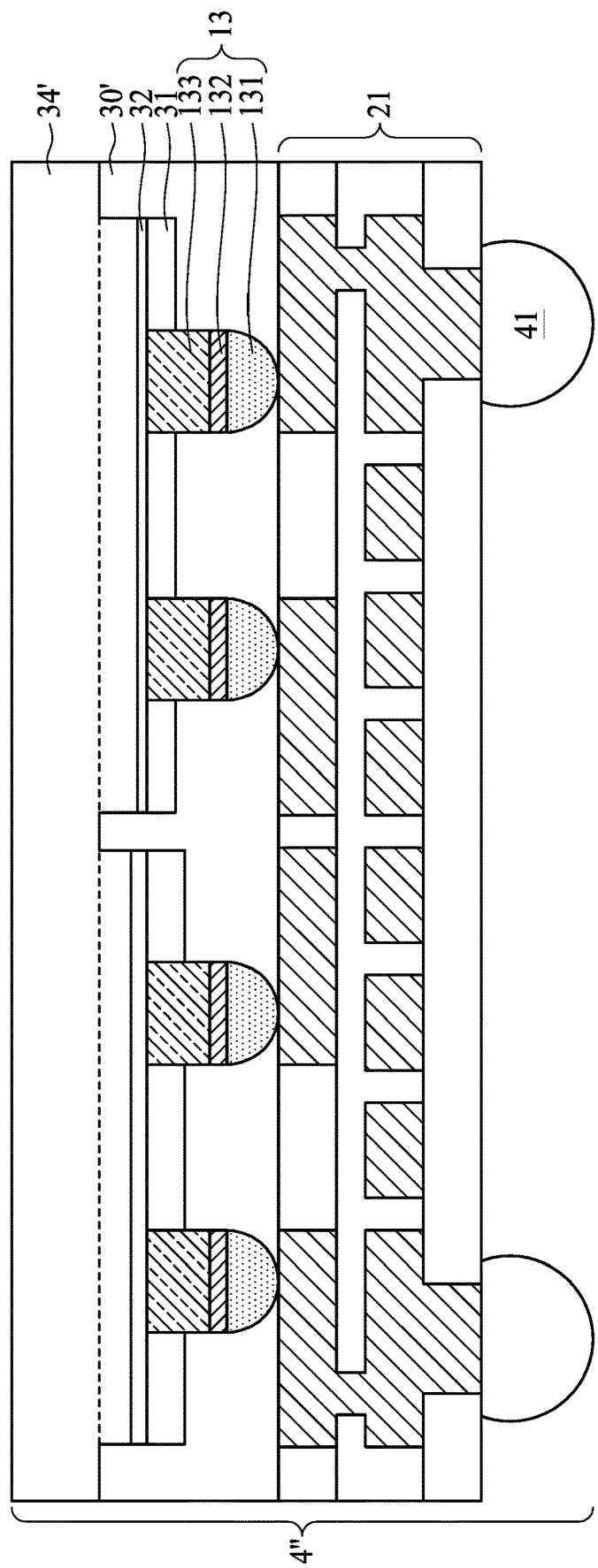

Referring to FIG. 6I, the carrier 52 is removed. A solder ball 41 is attached to the backside of the RDL 21. Subsequently, a package dicing operation is performed to form the semiconductor package structure 4".

As used herein, spatial descriptions, such as "above," "below," "up," "left," "right," "down," "front," "back," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
   a substrate;
   a die electrically connected to the substrate, having a front surface and a back surface opposite to the front surface;
   a first encapsulant proximal to the front surface and having an upper surface protruding from the back surface; and
   a second encapsulant proximal to the back surface and in contact with the upper surface of the first encapsulant.

2. The semiconductor package structure of claim 1, further comprising a third encapsulant between the substrate and the front surface of the die, contacting the front surface of the die.

3. The semiconductor package structure of claim 2, wherein the die further comprises a circuit layer and an insulating layer stacked on the second encapsulant.

4. The semiconductor package structure of claim 3, wherein the circuit layer and the insulating layer are surrounded by the first encapsulant.

5. The semiconductor package structure of claim 3, wherein the first encapsulant and the third encapsulant are between the circuit layer and the substrate.

6. The semiconductor package structure of claim 3, further comprising a redistribution layer (RDL) disposed between the substrate and the die.

7. The semiconductor package structure of claim 6, wherein the die further comprises a conductive element electrically connecting the circuit layer to the RDL.

8. The semiconductor package structure of claim 7, wherein the conductive element is a portion of an antenna structure.

9. The semiconductor package structure of claim 3, further comprising:
   a second die electrically connected to the substrate,
   wherein the second die comprises a circuit layer, an insulating layer, and an encapsulant proximal to the back surface and in contact with the third encapsulant and the circuit layer and the insulating layer stacked on the encapsulant,
   wherein an interface between the insulating layer and the second encapsulant of the die and an interface between the insulating layer and the encapsulant of the second die are not coplanar.

10. The semiconductor package structure of claim 3, wherein a side surface of the first encapsulant and a side surface of the second encapsulant are coplanar.

11. An antenna package structure, comprising:
    a substrate;
    a die electrically connected to the substrate, having a front surface and a back surface opposite to the front surface, the die comprising:
    an antenna structure; and
    a first die encapsulant over the antenna structure; and
    a package encapsulant over the first die encapsulant of the die,
    wherein the first die encapsulant and the package encapsulant are disposed over a vertical projection area of the antenna structure and the first die encapsulant is disposed between the antenna structure and the package encapsulant.

12. The antenna package structure of claim 11, wherein the die further comprises a second die encapsulant proximal to the front surface and in contact with the package encapsulant.

13. The antenna package structure of claim 12, wherein the antenna structure comprises a circuit layer and an insulating layer.

14. The antenna package structure of claim 13, wherein the second die encapsulant covers the insulating layer and the first die encapsulant.

15. The antenna package structure of claim 11, further comprising a redistribution layer (RDL) between the substrate and the die.

16. The antenna package structure of claim 15, wherein the antenna structure further comprises a conductive element extending from an insulating layer to the RDL.

17. An antenna package structure, comprising:
    a substrate;
    a die electrically connected to the substrate, having a front surface and a back surface opposite to the front surface, the die comprising:
    an antenna structure; and
    a first die encapsulant over the antenna structure;
    a package encapsulant over the first die encapsulant of the die,
    wherein the first die encapsulant and the package encapsulant are disposed over a vertical projection area of the antenna structure; and
    a redistribution layer (RDL) between the substrate and the die.

* * * * *